US012683117B2

(12) United States Patent
Schubert

(10) Patent No.: US 12,683,117 B2
(45) Date of Patent: Jul. 14, 2026

(54) MULTIPLE PARTICLE BEAM SYSTEM WITH A MIRROR MODE OF OPERATION, METHOD FOR OPERATING A MULTIPLE PARTICLE BEAM SYSTEM WITH A MIRROR MODE OF OPERATION AND ASSOCIATED COMPUTER PROGRAM PRODUCT

(71) Applicant: Carl Zeiss MultiSEM GmbH, Oberkochen (DE)

(72) Inventor: Stefan Schubert, Oberkochen (DE)

(73) Assignee: Carl Zeiss MultiSEM GmbH, Oberkochen (DE)

( * ) Notice: Subject to any disclaimer, the term of this patent is extended or adjusted under 35 U.S.C. 154(b) by 674 days.

(21) Appl. No.: 18/159,852

(22) Filed: Jan. 26, 2023

(65) Prior Publication Data

US 2023/0170181 A1 Jun. 1, 2023

Related U.S. Application Data

(63) Continuation of application No. PCT/EP2021/025296, filed on Aug. 4, 2021.

(30) Foreign Application Priority Data

Aug. 11, 2020 (DE) .......................... 102020121132.5

(51) Int. Cl.
 *H01J 37/26* (2006.01)
 *H01J 37/147* (2006.01)
 (Continued)

(52) U.S. Cl.
 CPC ........ *H01J 37/265* (2013.01); *H01J 37/1472* (2013.01); *H01J 37/22* (2013.01); (Continued)

(58) Field of Classification Search
 CPC .. H01J 37/00; H01J 37/02; H01J 37/09; H01J 37/14; H01J 37/1472; H01J 37/153; (Continued)

(56) References Cited

U.S. PATENT DOCUMENTS 4,130,761 A 12/1978 Matsuda
4,153,843 A 5/1979 Pease
 (Continued)

FOREIGN PATENT DOCUMENTS

DE 10 2013 014 976 A1 3/2015
DE 10 2013 016 113 A1 3/2015
 (Continued)

OTHER PUBLICATIONS

German Office Action, with translation thereof, for corresponding DE Appl No. 10 2020 121 132.5, dated Apr. 13, 2021.
 (Continued)

*Primary Examiner* — Jason L McCormack
(74) *Attorney, Agent, or Firm* — Fish & Richardson P.C.

(57) ABSTRACT

A multiple particle beam system with a mirror mode of operation, a method for operating a multiple particle beam system with a mirror mode of operation and an associated computer program product are disclosed. The multiple particle beam system can be operated in different mirror modes of operation which allow the multiple particle beam system to be inspected and recalibrated thoroughly. A detection system configured to operate in a first detection mode and/or in a second detection mode is used for the analysis.

20 Claims, 10 Drawing Sheets

(51) Int. Cl.

| | |
|---|---|
| *H01J 37/22* | (2006.01) |
| *H01J 37/244* | (2006.01) |
| *H01J 37/28* | (2006.01) |
| *H01J 37/09* | (2006.01) |
| *H01J 37/14* | (2006.01) |
| *H01J 37/153* | (2006.01) |
| *H01J 37/21* | (2006.01) |

(52) U.S. Cl.
CPC ............ *H01J 37/244* (2013.01); *H01J 37/28* (2013.01); *H01J 37/09* (2013.01); *H01J 37/14* (2013.01); *H01J 37/153* (2013.01); *H01J 37/21* (2013.01); *H01J 2237/0453* (2013.01); *H01J 2237/103* (2013.01); *H01J 2237/1532* (2013.01); *H01J 2237/2448* (2013.01)

(58) Field of Classification Search
CPC .......... H01J 37/21; H01J 37/22; H01J 37/244; H01J 37/26; H01J 37/265; H01J 37/28; H01J 37/29; H01J 2237/004; H01J 2237/0453; H01J 2237/103; H01J 2237/1532; H01J 2237/2448; H01J 2237/24564; H01J 2237/24592
USPC ................................. 250/306, 307, 310, 311
See application file for complete search history.

(56) References Cited

U.S. PATENT DOCUMENTS

| | | | |
|---|---|---|---|
| 4,200,794 | A | 4/1980 | Newberry |
| 4,338,548 | A | 7/1982 | Bono |
| 4,742,234 | A | 5/1988 | Feldman |
| 5,215,623 | A | 6/1993 | Takahashi |
| 5,864,142 | A | 1/1999 | Muraki |
| 5,892,224 | A | 4/1999 | Nakasuji |
| 5,905,267 | A | 5/1999 | Muraki |
| 5,981,954 | A | 11/1999 | Muraki |
| 6,107,636 | A | 8/2000 | Muraki |
| 6,124,599 | A | 9/2000 | Muraki |
| 6,137,113 | A | 10/2000 | Muraki |
| 6,323,499 | B1 | 11/2001 | Muraki |
| 6,333,508 | B1 | 12/2001 | Katsap |
| 6,617,595 | B1 | 9/2003 | Okunuki |
| 6,633,366 | B2 | 10/2003 | De Jager |
| 6,696,371 | B2 | 2/2004 | Butschke |
| 6,787,780 | B2 | 9/2004 | Hamaguchi |
| 6,804,288 | B2 | 10/2004 | Haraguchi |
| 6,818,911 | B2 | 11/2004 | Tamamori |
| 6,835,508 | B2 | 12/2004 | Butschke |
| 6,872,950 | B2 | 3/2005 | Shimada |
| 6,903,345 | B2 | 6/2005 | Ono |
| 6,903,353 | B2 | 6/2005 | Muraki |
| 6,917,045 | B2 | 7/2005 | Hashimoto |
| 6,919,574 | B2 | 7/2005 | Hashimoto |
| 6,943,349 | B2 | 9/2005 | Adamec |
| 6,953,938 | B2 | 10/2005 | Iwasaki |
| 6,992,290 | B2 | 1/2006 | Watanabe |
| 7,005,658 | B2 | 2/2006 | Muraki |
| 7,015,467 | B2 | 3/2006 | Maldonado |
| 7,060,984 | B2 | 6/2006 | Nagae |
| 7,084,411 | B2 | 8/2006 | Lammer-Pachlinger |
| 7,091,504 | B2 | 8/2006 | Wieland |
| 7,109,494 | B2 | 9/2006 | Ono |
| 7,126,141 | B2 | 10/2006 | Ono |
| 7,129,502 | B2 | 10/2006 | Kruit |
| 7,244,949 | B2 | 7/2007 | Knippelmeyer |
| 7,285,779 | B2 | 10/2007 | Litman |
| 7,332,730 | B2 | 2/2008 | Heinitz et al. |
| 7,375,326 | B2 | 5/2008 | Sender |
| 7,420,164 | B2 | 9/2008 | Nakasuji |
| 7,468,507 | B2 | 12/2008 | Rogers |
| 7,504,622 | B2 | 3/2009 | Elyasaf |
| 7,521,676 | B2 | 4/2009 | Okuda |
| 7,535,001 | B2 | 5/2009 | Sender |
| 7,601,972 | B2 | 10/2009 | Nakasuji |
| 7,619,203 | B2 | 11/2009 | Elyasaf |
| 7,696,497 | B2 | 4/2010 | Rogers |
| 8,035,082 | B2 | 10/2011 | Yamazaki |
| 8,080,790 | B2 | 12/2011 | Yamazaki |
| 8,134,135 | B2 | 3/2012 | Kruit |
| 8,350,214 | B2 | 1/2013 | Otaki |
| 8,362,425 | B2 | 1/2013 | Han |
| 8,384,051 | B2 | 2/2013 | Ozawa |
| 8,598,525 | B2 | 12/2013 | Zeidler |
| 8,618,496 | B2 | 12/2013 | Wieland |
| 8,704,192 | B2 | 4/2014 | Sano |
| 8,748,842 | B2 | 6/2014 | Ohashi |
| 8,779,399 | B2 | 7/2014 | Yamanaka |
| 8,829,465 | B2 | 9/2014 | Tsunoda |
| 8,963,099 | B2 | 2/2015 | Yamada |
| 9,153,413 | B2 | 10/2015 | Almogy |
| 9,263,233 | B2 | 2/2016 | Zeidler |
| 9,336,981 | B2 | 5/2016 | Knippelmeyer |
| 9,336,982 | B2 | 5/2016 | Zeidler |
| 9,349,571 | B2 | 5/2016 | Kemen |
| 9,368,314 | B2 | 6/2016 | Nakasuji |
| 9,530,613 | B2 | 12/2016 | Rogers |
| 9,536,702 | B2 | 1/2017 | Lang |
| 9,607,805 | B2 | 3/2017 | Liu |
| 9,653,254 | B2 | 5/2017 | Zeidler |
| 9,702,983 | B2 | 7/2017 | Eder |
| 9,922,799 | B2 | 3/2018 | Li |
| 9,991,089 | B2 | 6/2018 | Mueller |
| 10,062,541 | B2 | 8/2018 | Ren |
| 10,141,160 | B2 | 11/2018 | Ren |
| 10,354,831 | B2 | 7/2019 | Kemen |
| 10,388,487 | B2 | 8/2019 | Zeidler |
| 10,535,494 | B2 | 1/2020 | Zeidler |
| 10,541,112 | B2 | 1/2020 | Schubert |
| 10,586,677 | B1 | 3/2020 | Okada |
| 10,600,613 | B2 | 3/2020 | Zeidler |
| 10,622,184 | B2 | 4/2020 | Knippelmeyer |
| 10,643,820 | B2 | 5/2020 | Ren |
| 10,741,355 | B1 | 8/2020 | Zeidler |
| 10,811,215 | B2 | 10/2020 | Zeidler |
| 10,854,423 | B2 | 12/2020 | Sarov |
| 10,879,031 | B2 | 12/2020 | Ren |
| 10,896,800 | B2 | 1/2021 | Riedesel |
| 2001/0013581 | A1* | 8/2001 | Takemoto .............. B82Y 40/00 |
| | | | 250/492.22 |
| 2007/0194229 | A1 | 8/2007 | Okuda et al. |
| 2008/0073533 | A1 | 3/2008 | Makino |
| 2009/0014649 | A1 | 1/2009 | Nakasuji |
| 2010/0065753 | A1* | 3/2010 | Enyama ................ H01J 37/153 |
| | | | 250/397 |
| 2014/0151570 | A1 | 6/2014 | Kato et al. |
| 2014/0197325 | A1 | 7/2014 | Kato |
| 2017/0133198 | A1 | 5/2017 | Kruit |
| 2017/0315070 | A1* | 11/2017 | Kikuiri ................... H01J 37/28 |
| 2017/0316912 | A1 | 11/2017 | Zeidler et al. |
| 2019/0333732 | A1 | 10/2019 | Ren |
| 2019/0355551 | A1 | 11/2019 | Pavia |
| 2020/0211810 | A1 | 7/2020 | Zeidler |
| 2020/0243300 | A1 | 7/2020 | Zeidler |
| 2020/0373116 | A1 | 11/2020 | Zeidler |
| 2021/0005423 | A1 | 1/2021 | Zeidler |
| 2021/0035773 | A1 | 2/2021 | Zeidler |
| 2021/0192700 | A1 | 6/2021 | Zeidler et al. |
| 2021/0210303 | A1 | 7/2021 | Zeidler et al. |
| 2021/0210306 | A1 | 7/2021 | Zeidler et al. |
| 2021/0217577 | A1 | 7/2021 | Zeidler et al. |
| 2022/0102104 | A1 | 3/2022 | Fritz et al. |

FOREIGN PATENT DOCUMENTS

| | | |
|---|---|---|
| GB | 2519511 A | 4/2015 |
| GB | 2521819 A | 7/2015 |
| JP | 59184524 A | 10/1984 |
| JP | 60042825 A | 3/1985 |
| JP | 60105229 A | 6/1985 |
| JP | 61263217 A | 11/1986 |
| JP | 2014229481 A | 12/2014 |

(56)     References Cited

FOREIGN PATENT DOCUMENTS

| | | | |
|---|---|---|---|
| TW | 201633356 | A | 9/2016 |
| TW | I660390 | B | 5/2019 |
| TW | 201933412 | A | 8/2019 |
| WO | WO 2005/024881 | A2 | 3/2005 |
| WO | WO 2007/028595 | A2 | 3/2007 |
| WO | WO 2007/028596 | A1 | 3/2007 |
| WO | WO 2007/060017 | A2 | 5/2007 |
| WO | WO 2011/124352 | A1 | 10/2011 |
| WO | WO2013032949 | A1 | 3/2013 |
| WO | WO 2016/124648 | A1 | 8/2016 |
| WO | WO2020057678 | A1 | 3/2020 |
| WO | WO2020064035 | A1 | 4/2020 |
| WO | WO2020065094 | A1 | 4/2020 |
| WO | WO2020070074 | A1 | 4/2020 |
| WO | WO2020151904 | A2 | 7/2020 |
| WO | WO2020249147 | A1 | 12/2020 |

OTHER PUBLICATIONS

International Search Report and Written Opinion for corresponding PCT Appl No. PCT/EP2021/025296, dated Jan. 11, 2022.

J. Bigarré et al., *SEM-mirror methods and application to insular characterization*, IEEE transactions on Dielectrics and Electrical Insulation 8 (2008), p. 942-952.

Office Action in Taiwanese Appln. No. 110129160, mailed on May 22, 2025, 9 pages (with English summary).

\* cited by examiner

| Mode of operation | Control unit 10.2 Sample region voltage | Control unit 10.1 Multi-beam generator | Control unit 10.3 Second particle optical unit | Control unit 10.4 Detection mode |
|---|---|---|---|---|
| Normal mode of operation | $U_{Sample} > U_{Emitter}$ | On | On | 1 |
| Pupil observation mirror mode of operation | $U_{Sample} < U_{Emitter}$ | On | On | 2 |
| Shadow mirror mode of operation | $U_{Sample} < U_{Emitter}$ | Off | On | 2. |
| Detector observation mirror mode of oepration | $U_{Sample} < U_{Emitter}$ | On | On | 1 |
| Charge control mirror mode of operation | $U_{Sample} \approx U_{Emitter}$ | On, Off | On | 1, 2, Off |

Fig.10

MULTIPLE PARTICLE BEAM SYSTEM WITH A MIRROR MODE OF OPERATION, METHOD FOR OPERATING A MULTIPLE PARTICLE BEAM SYSTEM WITH A MIRROR MODE OF OPERATION AND ASSOCIATED COMPUTER PROGRAM PRODUCT

CROSS-REFERENCE TO RELATED APPLICATIONS

The present application is a continuation of, and claims benefit under 35 USC 120 to, international application PCT/EP2021/025296, filed Aug. 4, 2021, which claims benefit under 35 USC 119 of German Application No. 10 2020 121 132.5, filed Aug. 11, 2020. The entire disclosure of each of these applications are incorporated by reference herein.

FIELD

The disclosure relates to particle beam systems which operate with a multiplicity of particle beams.

BACKGROUND

Just like single-beam particle microscopes, multi-beam particle microscopes can be used to analyze objects on a microscopic scale. Images of an object that represent a surface of the object, for example, can be recorded using these particle microscopes. In this way, for example the structure of the surface can be analyzed. While in a single-beam particle microscope a single particle beam of charged particles, such as, for example, electrons, positrons, muons or ions, is used to analyze the object, in a multi-beam particle microscope, a plurality of particle beams are used for this purpose. The plurality of the particle beams, also referred to as a bundle, are directed at the surface of the object at the same time, as a result of which a significantly larger area of the surface of the object can be sampled and analyzed as compared with a single-beam particle microscope within the same period of time.

WO 2005/024 881 A2 discloses a multiple particle beam system in the form of an electron microscopy system which operates with a multiplicity of electron beams in order to scan an object to be examined using a bundle of electron beams in parallel. The bundle of electron beams is generated by an electron beam generated by an electron source being directed at a multi-aperture plate having a multiplicity of openings. One portion of the electrons of the electron beam strikes the multi-aperture plate and is absorbed there, and another portion of the beam passes through the openings in the multi-aperture plate, and so an electron beam is shaped in the beam path downstream of each opening, the cross section of the electron beam being defined by the cross section of the opening. Furthermore, suitably chosen electric fields provided in the beam path upstream and/or downstream of the multi-aperture plate have the effect that each opening in the multi-aperture plate acts as a lens on the electron beam passing through the opening, and so the electron beams are focused in a plane situated at a distance from the multi-aperture plate. The plane in which the foci of the electron beams are formed is imaged by a downstream optical unit onto the surface of the object to be examined, such that the individual electron beams strike the object in a focused manner as primary beams. There they generate interaction products, such as back-scattered electrons or secondary electrons, emanating from the object, which are shaped to form secondary beams and are directed at a detector by a further optical unit. There each of the secondary beams strikes a separate detector element such that the electron intensities detected by the detector element provide information relating to the object at the location at which the corresponding primary beam strikes the object. The bundle of primary beams is scanned systematically over the surface of the object in order to generate an electron micrograph of the object in the manner that is customary for scanning electron microscopes.

In practice, described multiple particle beam systems are often operated continuously with a high throughput. An example of this is the inspection of semiconductors. Frequent or regular system monitoring is desirable, for example in the case of continuous operation and/or in the case of a high throughput. By way of example, it is conventional to this end to carry out system monitoring and recalibration using a test sample.

The so-called mirror mode of operation ("mirror mode") offers a system monitoring and calibration option in the case of single beam systems. By way of example, the latter is described in U.S. Pat. No. 7,521,676 B2. In this case, work is carried out using a planar electron beam (a non-focused electron beam) which is directed in the direction of a sample but is at least partly reflected upstream thereof. This can allow defects to be recognized in the case of semiconductors. Although the document also briefly touches on a mirror mode of operation for a multiple particle beam system, the peculiarities of multiple particle beam systems remain unconsidered in that case. Additionally, mirror modes of operation have not previously been used in practice for system monitoring and calibration of multiple particle beam systems.

US 2008/0 073 533 A1 discloses a further single beam system which can be operated in a mirror mode of operation. J. Bigarré et al., "SEM-mirror Methods and Application to Insulator Characterization" IEEE Transactions on Dielectrics and Electrical Insolation 8 (2001), pages 942 to 952, discloses the use of a mirror mode of operation in a single beam electron microscope. The method serves to characterize insulator properties, and it discloses the targeted charging or the charge capture of insulators when high electric field strengths are present.

The German patent application DE 10 2013 016 113 A1 discloses a multi-beam particle microscope and, for example, details in relation to a detection system. The latter may contain a combination of a scintillator plate and a light detector. Additionally, the provision of a light-optical camera is disclosed, as a result of which a wide light-optical image of the scintillator plate is detectable. The document does not disclose a mirror mode of operation.

SUMMARY

The disclosure seeks to improve existing multiple particle beam systems. For example, the disclosure seeks to provide improved options for system monitoring and recalibration, which take account of the peculiarities of multiple particle beam systems.

The disclosure also seeks to refine mirror modes of operation, such as for multiple particle beam systems. These can be able to be integrated in existing systems, such as in flexible and efficient fashion.

According to a first aspect of the disclosure, the disclosure relates to a multiple particle beam system comprising the following:

at least one particle source which is configured to generate a first charged particle beam;

a micro-optical unit with a multi-beam generator, which is configured to generate a first field of a multiplicity of charged individual particle beams from the first charged particle beam;

a first particle optical unit with a first particle optical beam path, which is configured to direct the generated individual particle beams at a sample and/or in the direction of a sample such that the first particle beams strike the sample at locations of incidence and/or reach reversal locations upstream of the sample which form a second field;

a detection system;

a second particle optical unit with a second particle optical beam path, which is configured to image second individual particle beams, which emanate from the locations of incidence in the second field or from the reversal locations in the second field, onto the detection system;

a particle optical objective lens, through which both the first and the second individual particle beams pass;

a beam switch, which is arranged in the first particle optical beam path between the multi-beam particle source and the objective lens and which is arranged in the second particle optical beam path between the objective lens and the detection system; a sample region voltage supply, which is configured to provide an adjustable sample region voltage in the sample region; and a controller which is configured to control the micro-optical unit, the particle optical objective lens, the first particle optical unit, the second particle optical unit, the detection system and the sample region voltage supply, wherein the detection system is configured to operate in a first and in a second detection mode, wherein, in the first detection mode, the second individual particle beams are imaged on detection regions of the detection system which form a third field, wherein a two-dimensional image is generated in the second detection mode, wherein the controller is configured to provide a normal mode of operation and a mirror mode of operation, wherein, in the normal mode of operation, the detection system is operated in the first detection mode, wherein, in the normal mode of operation, the sample region voltage is set such that the generated first individual particle beams are incident on the sample and release a multiplicity of secondary particles in the form of second individual particle beams from the sample, the secondary particles being imaged on the detection system after passing through the second particle optical unit, wherein, in the mirror mode of operation, the detection system is operated in the first and/or in the second detection mode, and wherein, in the mirror mode of operation, the sample region voltage is set such that at least some of the first individual particle beams are not incident on the sample but are reflected as second individual particle beams, wherein the second individual particle beams are imaged on the detection system after passing through the second particle optical unit.

The charged particles can be for example electrons, positrons, muons or ions or other particles. Optionally, the charged particles are electrons generated, e.g., using a thermal field emission source (TFE). However, other particle sources can also be used.

The first particle optical unit with a first particle optical beam path is configured to direct the generated individual particle beams at a sample and/or in the direction of a sample such that the first particle beams strike the sample at locations of incidence and/or reach reversal locations upstream of the sample which form a second field. Thus, in general, the first particle optical unit serves to image the first field of the charged individual particle beams on the second field. In this case, this imaging may be focused but it may also be defocused. For example, it is also possible that the first particle beams strike the sample at locations of incidence as planar beam or reach reversal locations upstream of the sample as planar beams.

Whether the individual particle beams reach the sample or else are reversed, for example just in front of the sample, substantially depends on the sample region voltage supply, the latter being configured to provide an adjustable sample region voltage in the sample region. Depending on the mode of operation the sample region voltage supply is controlled differently by the controller. By way of example, if the charged particles are electrons the sample region voltage or the sample region potential is positive in comparison with the emitter voltage or the emitter potential in the normal mode of operation. By way of example, the emitter voltage is approximately −20 000 V, −25 000 V, −30 000 V or −35 000 V. Then, the sample region voltage is higher by a few hundred volts, for example, and so the electrons have for example a landing energy of between approximately 150 eV and approximately 3000 eV.

By contrast, if the multiple particle beam system with electrons is operated in a mirror mode of operation the sample region voltage is more negative than the emitter voltage or else the sample region voltage and the emitter voltage have approximately the same magnitude. If the sample region voltage really is smaller than the emitter voltage the first particle beams in the form of electrons do not reach the sample but are reversed at reversal locations which are as close as possible in front of the sample. If the sample region voltage and the emitter voltage are approximately identical an incidence of the electrons on the sample or a reversal of the electrons in front of the sample may depend sensitively on a position on the sample, the topography thereof and, for example, on the charge state thereof. If the sample regions are positively charged the electrons are incident on the sample and generate secondary electrons. By contrast, if the positions on the sample are charged negatively the electrons are not incident on the sample but the associated particle beams are reflected as secondary particle beams or mirror election particle beams in front of the sample. Thus, the mirror mode of operation has a plurality of options for operating the mirror mode of operation. Examples in this respect are presented in more detail below. In accordance with an embodiment of the disclosure, the multiple particle beam system comprises at least one operating element such as, for example, an operating field or a switch which allows a user to choose and/or further adjust the mode of operation or the modes of operation.

The multiple particle beam system according to the disclosure can comprise a detection system which is configured to operate in a first detection mode and in a second detection mode. In the first detection mode, the second individual particle beams are imaged on detection regions which form a third field. In the second detection mode, a two-dimensional image is generated. Different images are obtained in the two detection modes and it is possible but not necessary to use different detection units. By way of example, it is also possible to control the same detection system differently in the two modes, for example by combining detection regions to form a field point in the third field. The emphasis of the normal mode of operation lies primarily in obtaining information about the beam intensity levels of the second individual particle beams which emanate from the locations of incidence in the second field on the sample and are each imaged on the third field on an associated detection region. No two-dimensional image arises in the process; the latter is only generated later by computation. Things are different in the second detection mode, in which a two-dimensional image can be generated (directly).

By default, the first detection mode is used in the normal mode of operation of the multiple particle beam system. By contrast, the second detection mode can be used as an alternative or in addition to the first detection mode in the mirror mode of operation. Depending on the purpose of the inspection, the controller can be used to control the detection system in the detection mode best suited for the respective purpose. Thus, the multiple particle beam system according to the disclosure offers great flexibility in this case for measurements and inspections.

According to an embodiment of the disclosure, the detection system is set up to realize the first and the second detection mode purely on account of the controller controlling the detection system differently. Thus, no physical component of the detection system is exchanged for the realization of the two modes.

According to an embodiment of the disclosure, the detection system comprises a first detection unit and a second detection unit, wherein the first detection unit is controlled by the controller in the first detection mode and the second detection unit is controlled by the controller in the second detection mode. Thus, the detection system has in this case two components which physically differ from one another at least in part.

According to an embodiment of the disclosure, the first detection unit can comprises a particle detection unit and a light detection unit; and/or the second detection unit comprises a particle detection unit and a light detection unit. Here, it is possible, for example, for the particle detection unit to belong to both the first detection unit and the second detection unit and for the actual difference between the detection units to lie in the utilized light detection units. Thus, the two light detection units of the first detection unit and of the second detection unit are not realized by the same component.

According to an embodiment of the disclosure, the light detection unit of the first detection unit comprises an avalanche photodiode; and/or the light detection unit of the second detection unit comprises a CCD camera. The use of avalanche photodiodes has proven its worth in practice for scans using the multiple particle beam systems where the emphasis lies in determining the intensity of the secondary particle beams as accurately as possible. By contrast, a CCD camera has proven its worth when recording two-dimensional images. Moreover, in this embodiment variant, a mirror or beam splitter may be arranged in the beam path downstream of a common particle detection unit in the beam path between the particle detection unit and the light detection unit of the first detection unit and between the particle detection unit and the light detection unit of the second detection unit. If a beam splitter is used recordings can be made simultaneously via the first detection unit and via the second detection unit. However, use can also be made of a mirror, for example by way of an introduction into the system, such that light of the assigned second individual particle beams is measured either by the first light detection unit or by the second light detection unit. It is also possible to insert the second detection unit into the beam path of the detection system. These designs of the multiple particle beam system allow great flexibility during inspection and calibration procedures.

According to an embodiment of the disclosure, the sample region voltage supply is configured to provide a variable voltage at the sample stage. Thus, the voltage can be chosen and applied accordingly via the controller. Alternatively, it is also possible to apply a corresponding voltage or provide a corresponding voltage not at the sample stage itself but in the vicinity of the sample stage. The voltage can be chosen in the process, for example continuously. However, it is also possible to only provide a variable voltage at a plurality of levels.

According to an embodiment of the disclosure, the controller is configured in such a way that there is alternating between the normal mode of operation and the mirror mode of operation. In this case, it is possible for example to implement the mirror mode of operation whenever the normal mode of operation is currently not required. A sample change is an example therefor. However, it is also possible to change into the mirror mode of operation, for example for regular inspection or recalibration purposes, after a fixed time interval, for example after a certain operating time has elapsed in the normal mode of operation. It is also possible to change into the mirror mode of operation by way of an operator's control command while maintenance is carried out in the multiple particle beam system. In this way, the mirror mode of operation can be integrated into the operation of a multiple particle beam system without relatively large losses in respect of the operating time during the normal mode of operation.

According to an embodiment of the disclosure, the micro-optical unit of the multiple particle beam system comprises the following:

the multi-beam generator;

a multi-stigmator, which is configured to individually adjust a stigmation of the first individual particle beams via the controller; and/or a multi-focus correction mechanism, which is set up to individually correct a focus of the first individual particle beams via the controller. In general, the multi-beam generator, the multi-stigmator and also the multi-focus correction mechanism is known. However, with the aid of the controller according to the disclosure, the individual components of the micro-optical unit can be controlled in a special way and used for inspection purposes in the multiple particle beam system according to the disclosure. In this respect, more detailed explanations follow below.

According to an embodiment of the disclosure, the multi-beam generator comprises a multi-lens array with a multi-aperture plate and with a counter electrode. If the charged individual particle beams pass through this multi-beam generator, the individual particle beams are focused during the passage therethrough and a real intermediate image arises. Then, the beam foci form the above-described first field of the multiplicity of charged individual particle beams.

According to a further embodiment of the disclosure, the multi-beam generator comprises a multi-aperture plate and a multi-deflector array. The individual particle beams formed are deflected in a targeted manner when passing through the multi-deflector array. As a result, virtual foci arise in the beam path of the particles upstream of the multi-deflector array, the foci being able to be considered as initial points or first field of the first individual particle beams.

It is also possible to combine the two aforementioned embodiment variants with the multi-lens array and multi-deflector array.

According to an embodiment of the disclosure, the first particle optical unit comprises at least one global lens system. In this case, a global lens system is understood to mean a lens system having at least one lens, with all of the first individual particle beams passing through the same lens or the same lenses. By way of example, a global field lens system can be a constituent part of the first particle optical unit. The aforementioned objective lens can also be a global lens, for example a magnetic global lens; it is part both of the first particle optical unit and of the second particle optical unit. The first particle optical unit is controlled via the controller; for example, this then also allows the global lenses or one or more global lens systems to be controlled via the controller.

According to an embodiment of the disclosure, the second particle optical unit comprises a projection lens system. The projection lens system can comprise one or more projection lenses; for example, this can be a global projection lens system. Optionally, the projection lens system comprises exactly two or exactly three projection lenses. However, it might also comprise only one projection lens or more than three projection lenses, for example four, five or six projection lenses.

A plurality of mirror modes of operation of the multiple particle beam system are described in more detail below. Here, for example, aspects of the individual mirror modes of operation are discussed.

According to an embodiment of the disclosure, the latter comprises a multiple particle beam system as described above in various embodiment variants, wherein the detection system is operated in the second detection mode in the mirror mode of operation, wherein, in the mirror mode of operation, the sample region voltage is set via the controller such that the first individual particle beams are not incident on the sample but are reflected as second individual particle beams, wherein, in the mirror mode of operation, the second particle beams are imaged on the detection system after passing through the second particle optical unit, and wherein the controller is configured in such a way that, in the normal mode of operation and in the mirror mode of operation, the multi-beam generator is controlled in substantially the same way.

This mirror mode of operation can also be referred to as pupil observation mirror mode of operation. Thus, the pupil observation mirror mode of operation substantially differs from the normal mode of operation in terms of an altered sample region voltage. If the micro-optical unit comprises the multi-beam generator, the multi-stigmator and the multi-focus correction mechanism, the control of the aforementioned mechanism can also remain substantially the same within the normal mode of operation and within the pupil observation mirror mode of operation, although this need not be the case. In the pupil observation mirror mode of operation, the first individual particle beams are not incident on the sample but reverse in front of the sample, as close thereto as possible, and are reflected as mirror electron beams.

The pupil observation mirror mode of operation can be used to inspect or check the functionality of the multi-beam generator and/or of the micro-optical unit. Here, it can be the case that the controller is configured so that the control of the second particle optical unit is varied in the pupil observation mirror mode of operation. A Component of the second particle optical unit can be, for example, the projection lens system as described above. The control of the projection lens system or of the individual global projection lenses can be varied by the controller. As a result of the different levels of excitement of the projection lens system, different planes of the particle optical unit can be imaged via the detection system in the second detection mode. In general, the observation plane is displaced in the process. For example, it is possible to identify accumulations of charge on the micro-optical unit and partly or entirely blocked individual particle beams in this mirror mode of operation.

According to an embodiment of the disclosure, the controller is configured in such a way that the control of the second particle optical unit, for example the control of the projection lens system, is varied step-by-step in the mirror mode of operation and wherein a recording is made via the detection system in each step. In this case, a zoom is thus carried out through the pupil of the lens system. The term pupil of the light-optical unit comes from the light optics. The step-by-step variation or the zooming through is rendered comprehensible or documented by the recordings via the detection system in the second detection mode. By way of example, different observation planes of interest might be imaged via the detection system as a result of the variation. The recordings can be evaluated in manual or automated fashion and the multiple particle beam system, for example the multi-beam generator and/or the micro-optical unit, can be recalibrated and finely adjusted accordingly.

According to a further embodiment of the disclosure, the latter comprises a multiple particle beam system as described previously in various embodiment variants, wherein the detection system is operated in the second detection mode in the mirror mode of operation, wherein, in the mirror mode of operation, the sample region voltage is set via the controller such that the first individual particle beams are not incident on the sample but are reflected as second individual particle beams, wherein, in the mirror mode of operation, the second individual particle beams are imaged on the detection system after passing through the second particle optical unit, and wherein the controller is configured in such a way that, in the mirror mode of operation, the multi-beam generator is switched off.

This mirror mode of operation can also be referred to as shadow mirror mode of operation. For example, this mode lacks the principal focusing effect of the multi-beam generator. Therefore, substantially shadows arise at the multi-aperture plate or at the multi-aperture plate system in the micro-optical unit.

According to an embodiment of the disclosure, the controller is configured in such a way that the multi-stigmator and/or the multi-focus correction mechanism(s) is/are switched on in the shadow mirror mode of operation. In this case, the control of the multi-stigmator and/or of the multi-focus correction mechanism can remain unchanged in comparison with the normal mode of operation, but it can also be varied. The functionality of the multi-stigmator and/or of the multi-focus correction mechanism can be checked in the shadow mirror mode of operation. This is because small errors, such as for example angular deviations of a few individual particle beams from the ideal direction, have a comparatively strong effect in the shadow mirror mode of operation and can be identified.

Optionally, the controller is configured to control the global lens system of the first particle optical unit in such a way in the mirror mode of operation that the first individual particle beams substantially pass through the beam switch and global apertures. In this way, a shadow or planar individual particle beams, which reverse in front of the sample, is/are obtained even just in front of the sample.

According to an embodiment of the disclosure, the controller is configured in such a way that the control of the second particle optical unit is varied in the mirror mode of operation or shadow mirror mode of operation. In the process, it is possible, for example, to control the projection lens system of the second particle optical unit in different ways (e.g., zoom therethrough) and thus image the shadow image by the individual particle beams after passing through the multi-beam generator at different levels on the detection system.

According to an embodiment of the disclosure, the controller is configured in such a way that the control of the second particle optical unit, for example the control of the projection lens system, is varied step-by-step in the mirror mode of operation or in the shadow mirror mode of operation and wherein a recording is made via the detection system in each step. In this way, it is possible to pass through different positions in the shadow image downstream of the multi-beam generator and this allows identification of otherwise only weakly identifiable malfunctions of, e.g., the multi-stigmator and/or the multi-focus correction mechanism.

According to a further embodiment of the disclosure, the latter comprises a multiple particle beam system as described previously in various embodiment variants, wherein the detection system is operated in the first detection mode in the mirror mode of operation, wherein, in the mirror mode of operation, the sample region voltage is set via the controller such that the first individual particle beams are not incident on the sample in the mirror mode of operation but are reflected as second individual particle beams, wherein the second individual particle beams are imaged on the detection system after passing through the second particle optical unit, and wherein the controller is configured in such a way that, in the normal mode of operation and in the mirror mode of operation, the multi-beam generator is controlled in substantially the same way.

This mirror mode of operation can also be referred to as detector observation mirror mode of operation. It differs from the pupil observation mirror mode of operation by way of the operation of the detection system in the first detection mode. In general, it is also possible to carry out the pupil observation mirror mode of operation and the detector observation mirror mode of operation simultaneously if an appropriate detection system is used.

The detector observation mirror mode of operation substantially serves to test or validate the detection regions of the first detection unit. To this end, interactions with the sample are precluded when the mirror mode of operation is used and this renders possible an inspection of the detection regions without being influenced by the sample.

According to an embodiment of the disclosure, the controller is configured in such a way that the second individual particle beams are guided over the detection system in the mirror mode of operation or in the detector observation mirror mode of operation such that a scan image of the detection system is generated. It is normally the case during the normal operation of a multiple particle beam system that the second individual particle beams are incident substantially at a fixed location and in telecentric fashion on the detection regions of the third field as a result of using scan deflectors. The intensity of the incident second individual particle beams is then related to the sample surface or the topology thereof. By contrast, the interaction with the sample is eliminated in the detector observation mirror mode of operation. By switching off parts of the scan deflectors or by an alternative control of the scan deflectors via the controller, the reflected second individual particle beams are guided over the detection system. Thus, multiple images arise in each detection region since each of the second individual particle beams is imaged on the detection region.

According to an alternative embodiment of the disclosure, a position of the second individual particle beams on the detection system is kept constant in the detector observation mirror mode of operation so that it is possible to carry out a detection quantum efficiency analysis for the detection regions of the detection system. Statistical noise is expected in this mode of operation. If this is not the case, individual detection regions, for example, can be set differently or can be replaced.

According to an embodiment of the disclosure, the latter comprises the multiple particle beam system as described previously in various embodiment variants, wherein the detection system is operated in the first detection mode in the mirror mode of operation, wherein, in the mirror mode of operation, the sample region voltage is set such that it approximately corresponds to the voltage of the particle source so that at least some of the first individual particle beams are not incident on the sample but are reflected as second individual particle beams, wherein the second individual particle beams are imaged on the detection system after passing through the second particle optical unit in the mirror mode of operation.

Firstly the topology of the sample and secondly the charge state in different sample regions can be decisive for whether an individual particle beam is incident on the sample and releases secondary electrons there or whether an individual particle beam is not incident on the sample but reflected just in front thereof. This mirror mode of operation can also be referred to as charge control mirror mode of operation. The first individual particle beams can be incident on the sample in focused or defocused fashion. For example, they can be incident on the sample as planar individual particle beams.

According to an embodiment of the disclosure, the controller is configured in such a way that there is such alternating between the charge control mirror mode of operation or the mirror mode of operation and the normal mode of operation that, in the mirror mode of operation, local charges on a sample are generated or compensated. This alternating manner of operation between the mirror mode of operation on the one hand and the normal mode of operation on the other hand can prevent the image quality of an image representation in the first detection mode becoming ever poorer on account of unwanted charge accumulations on the sample. It is even possible to choose the sample region voltage in such a way that an individual particle beam automatically switches off or transitions from impinging on the sample to reflecting in front of the sample in the mirror mode of operation when the desired charge or target charge is attained in the assigned region of the sample.

A detection of the second individual particle beams may even be partly or entirely dispensed with in the charge control mirror mode of operation. By way of example, there is no need for a recording if the object is to generate or neutralize a certain charge accumulation on the sample prior to a recording in the normal mode of operation, and consequently even just provide the conditions for a good recording in the normal mode of operation. Equally, a recording can be made in the mirror mode of operation, for example to image the charge state on the sample.

According to a second aspect of the disclosure, the latter relates to a multiple particle beam system comprising the following:

at least one particle source which is configured to generate a first charged particle beam;

a micro-optical unit with a multi-beam generator, which is configured to generate a first field of a multiplicity of charged individual particle beams from the first charged particle beam;

a first particle optical unit with a first particle optical beam path, which is configured to direct the generated individual particle beams at a sample and/or in the direction of a sample such that the first particle beams strike the sample at locations of incidence and/or reach reversal locations upstream of the sample which form a second field;

a detection system;

a second particle optical unit with a second particle optical beam path, which is configured to image second individual particle beams, which emanate from the locations of incidence in the second field or from the reversal locations in the second field, onto the detection system;

a particle optical objective lens, through which both the first and the second individual particle beams pass;

a beam switch, which is arranged in the first particle optical beam path between the multi-beam particle source and the objective lens and which is arranged in the second particle optical beam path between the objective lens and the detection system;

a sample region voltage supply, which is configured to provide an adjustable sample region voltage in the sample region; and a controller which is configured to control the micro-optical unit, the particle optical objective lens, the first particle optical unit, the second particle optical unit, the detection system and the sample region voltage supply, wherein the detection system is configured to work in a first and in a second detection mode, wherein, in the first detection mode, the second individual particle beams are imaged on detection regions of the detection system which form a third field, wherein a two-dimensional image is generated in the second detection mode, wherein the controller is configured to provide a normal mode of operation and a mirror mode of operation, wherein, in the normal mode of operation, the sample region voltage is set such that the generated first individual particle beams are incident on the sample and separate a multiplicity of secondary particles in the form of second individual particle beams from the sample, the secondary particles being imaged on the detection system after passing through the second particle optical unit, wherein the detection system is operated in the first detection mode in the normal mode of operation, and wherein, in the mirror mode of operation, the sample region voltage is set such that it approximately corresponds to the voltage of the particle source, and so at least some of the first individual particle beams are not incident on the sample but are reflected as second individual particle beams.

This embodiment variant of the disclosure also comprises a charge control mirror mode of operation as a mode of operation. However, detection in the mirror mode of operation can be dispensed with in this embodiment. Otherwise, this embodiment of the disclosure can also be combined with the above-described technical features as per the first aspect of the disclosure.

According to a third aspect of the disclosure, the latter relates to a method for operating a multiple particle beam system, for example a multiple particle beam system as described above in various embodiment variants, the method including the following steps:

operating the multiple particle beam system in a mirror mode of operation, comprising:

generating a multiplicity of charged first individual particle beams, reflecting at least some individual particle beams, for example all individual particle beams, before the sample is reached, and detecting at least the reflected beams in the form of a multiplicity of second individual particle beams via a detection system in a first detection mode and/or in a second detection mode.

Here, the statements already made above in the context of the multiple particle beam system apply to the first detection mode and to the second detection mode. Furthermore, this also applies analogously to all further components and features specified within the scope of the description of the method; the specified components and features may be, but need not be, configured or constructed as has already been described in the context of the description of the multiple particle beam system.

According to the disclosure, at least the reflected beams in the form of the second individual particle beams are detected. It is also possible that interaction products released from a sample, such as for example secondary electrons, are detected via the detection system in addition to the reflected beams. This applies, for example, if the mirror mode of operation is a charge control mirror mode of operation. Reference is made to the explanations above in respect of the details for this charge control mirror mode of operation.

According to an embodiment of the disclosure, the method for operating a multiple particle beam system furthermore includes the following steps:

operating the multiple particle beam system in a normal mode of operation, comprising:

generating a multiplicity of charged first individual particle beams, scanning a sample with the multiplicity of individual particle beams, and detecting interaction products in the form of a multiplicity of second individual particle beams, which emanate from the sample, via the detection system in the first detection mode.

This normal mode of operation is the standard mode of operation of a multiple particle beam system, as is already known. Thus, the multiple particle beam system can be operated either in a mirror mode of operation or in a normal mode of operation. Switching between these two modes can be implemented purely on account of a different control of components of the multiple particle beam system. For example, a change between the normal mode of operation and the mirror mode of operation can be achieved by varying an adjustable sample region voltage. The latter decides decisively whether the first individual particle beams reach a sample and release interaction products there or whether these are reflected (just) in front of the sample.

According to an embodiment of the disclosure, there is alternating, for example multiple alternating, between the normal mode of operation and the mirror mode of operation. Here, the mirror mode of operation can be carried out in the same way or differently in each case. By way of example, it is possible for the mirror mode of operation to be the pupil observation mirror mode of operation in one case and the detector observation mirror mode of operation in the other case. Other combinations are also possible.

Optionally, there is a change from the normal mode of operation to the mirror mode of operation when there is a sample change. In this case, it is not possible to work in the normal mode of operation in any case and the presence of a sample is not required or is even undesirable for most mirror modes of operation. It is also possible to carry out a change between the various modes of operation manually by way of the input of a user. By way of example, this may be the case if the data evaluation reveals apparent errors during the image recording or if other abnormalities are observed. It is also possible to change between the modes within the scope of servicing of the multiple particle beam system.

According to an embodiment of the disclosure, the multiplicity of first individual particle beams are generated via a multi-beam generator and the method furthermore includes the following step:

inspecting the multi-beam generator in respect of its functionality in the mirror mode of operation.

In this case, the multi-beam generator can be inspected in the pupil observation mirror mode of operation, as already described above, for example. However, the inspection may also be implemented within the scope of the shadow mirror mode of operation.

According to an embodiment of the disclosure, the multiple particle beam system comprises the following:

a multi-beam generator for generating the multiplicity of individual particle beams;

a multi-stigmator, which is configured to individually adjust a stigmation of the individual particle beams via the controller; and/or a multi-focus correction mechanism, which is set up to individually correct a focus of the first individual particle beams via the controller; and the method furthermore includes the following step of inspecting the multi-stigmator and/or the multi-focus correction mechanism, in each case in respect of its functionality, in the mirror mode of operation.

The shadow mirror mode of operation is suitable for this inspection step. In this case, small deviations in the optical unit which would hardly be noticed during normal operation or when focusing the individual particle beams are noticeable.

According to an embodiment of the disclosure, the method furthermore includes the following step of inspecting the detection system in the first detection mode in the mirror mode of operation.

In this case, the detection system can be inspected in the detector observation mirror mode, for example. In the process, the individual particle beams may be scanned over the detection regions of the detection system in the mirror mode of operation such that a scan image of the detector is obtained in this way. In this case, the incident individual particle beams can be incident on the detector in oblique or focused fashion. Alternatively, it is also possible for the second individual particle beams not to be scanned over the detector or the detection system but for the second individual particle beams to be used to carry out a detection quantum efficiency analysis upon incidence on the individual detection regions of the detection system. In theory, statistical noise is expected in this case. Error sources or defective detection regions can be deduced in the case of deviations therefrom.

According to an embodiment of the disclosure, the method furthermore includes the following step of generating or neutralizing charges on a sample in the mirror mode of operation.

For example, these method steps can be carried out in the charge control mirror mode of operation. In the context of this embodiment variant, too, there optionally is a change between the mirror mode of operation on the one hand and the normal mode of operation on the other hand. By way of example, it is possible to initially generate or neutralize the desired charges on a sample and subsequently generate a standard recording via the multiple particle beam system in the normal mode of operation.

According to a fourth aspect of the disclosure, the latter relates to a computer program product having a program code for carrying out the method as described above in a plurality of embodiment variants. In this case, the program code can be subdivided into one or more partial codes. It is appropriate, for example, to provide the code for controlling the multiple particle beam system in the normal mode of operation separately in one program part, while another program part contains the routines for operating the multiple particle beam system in the mirror mode of operation. However, other divisions of the code or even no divisions of the code into subregions are also possible as a matter of principle.

The above-described embodiments of the disclosure can be combined with one another in full or in part. This also applies to the first, second, third and fourth aspect of the disclosure and a combination of embodiments belonging to one another in this respect with one another. Technical contradictions should not occur in such a combination of embodiment variants.

BRIEF DESCRIPTION OF THE DRAWINGS

The disclosure will be understood even better with reference to the accompanying figures:

FIG. 10: shows in a table options for controlling the multiple particle beam system.

DETAILED DESCRIPTION

Below, the same reference signs denote the same features, even if these are not explicitly mentioned in the text.

Figure 1:
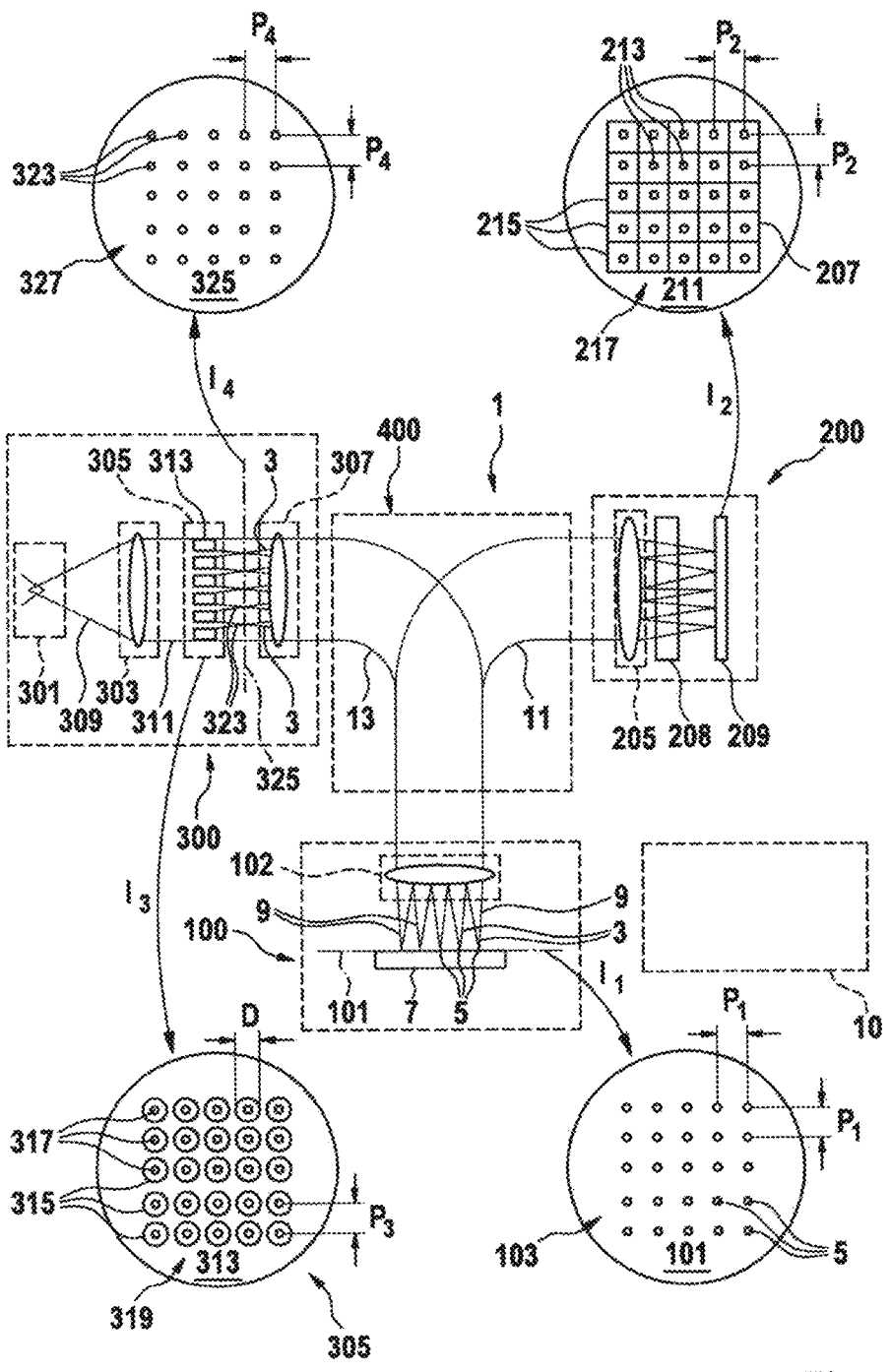
FIG. 1: shows a schematic illustration of a particle beam system in the form of a multi-beam particle microscope.

FIG. 1 is a schematic illustration of a particle beam system 1 in the form of a multi-beam particle microscope 1, which uses a multiplicity of particle beams. The particle beam system 1 generates a multiplicity of particle beams which strike an object to be examined in order to generate there interaction products, e.g., secondary electrons, which emanate from the object and are subsequently detected. The particle beam system 1 is of the scanning electron microscope (SEM) type, which uses a plurality of primary particle beams 3 which are incident on a surface of the object 7 at a plurality of locations 5 and generate there a plurality of electron beam spots, or spots, that are spatially separated from one another. The object 7 to be examined can be of any desired type, e.g., a semiconductor wafer or a biological sample, and comprise an arrangement of miniaturized elements or the like. The surface of the object 7 is arranged in a first plane 101 (object plane) of an objective lens 102 of an objective lens system 100.

The enlarged excerpt $I_1$ in FIG. 1 shows a plan view of the object plane 101 having a regular rectangular field 103 of locations of incidence 5 formed in the first plane 101. In FIG. 1, the number of locations of incidence is 25, which form a 5×5 field 103. The number 25 of locations of incidence is a number chosen for reasons of simplified illustration. In practice, the number of beams, and hence the number of locations of incidence, can be chosen to be significantly greater, such as, for example, 20×30, 100×100 and the like.

In the embodiment illustrated, the field 103 of locations of incidence 5 is a substantially regular rectangular field having a constant pitch $P_1$ between adjacent locations of incidence. Exemplary values of the pitch $P_1$ are 1 micrometer, 10 micrometers and 40 micrometers. However, it is also possible for the field 103 to have other symmetries, such as a hexagonal symmetry, for example.

A diameter of the beam spots shaped in the first plane 101 can be small. Exemplary values of the diameter are 1 nanometer, 5 nanometers, 10 nanometers, 100 nanometers and 200 nanometers. The focusing of the particle beams 3 for shaping the beam spots 5 is carried out by the objective lens system 100.

The primary particles striking the object generate interaction products, e.g., secondary electrons, back-scattered electrons or primary particles that have experienced a reversal of movement for other reasons, which emanate from the surface of the object 7 or from the first plane 101. The interaction products emanating from the surface of the object 7 are shaped by the objective lens 102 to form secondary particle beams 9. The particle beam system 1 provides a particle beam path 11 for guiding the multiplicity of secondary particle beams 9 to a detector system 200. The detector system 200 comprises a particle optical unit with a projection lens 205 for directing the secondary particle beams 9 at a particle multi-detector 209.

The excerpt $I_2$ in FIG. 1 shows a plan view of the plane 211, in which individual detection regions of the particle multi-detector 209 on which the secondary particle beams 9 are incident at locations 213 are located. The locations of incidence 213 lie in a field 217 with a regular pitch $P_2$ with respect to one another. Exemplary values of the pitch $P_2$ are 10 micrometers, 100 micrometers and 200 micrometers.

The primary particle beams 3 are generated in a beam generation apparatus 300 comprising at least one particle source 301 (e.g., an electron source), at least one collimation lens 303, a multi-aperture arrangement 305 and a field lens 307, or a field lens system made of a plurality of field lenses. The particle source 301 generates at least one diverging particle beam 309, which is collimated or at least substantially collimated by the at least one collimation lens 303 in order to shape a beam 311 which illuminates the multi-aperture arrangement 305.

The excerpt $I_3$ in FIG. 1 shows a plan view of the multi-aperture arrangement 305. The multi-aperture arrangement 305 comprises a multi-aperture plate 313, which has a plurality of openings or apertures 315 formed therein. Midpoints 317 of the openings 315 are arranged in a field 319 that is imaged onto the field 103 formed by the beam spots 5 in the object plane 101. A pitch $P_3$ between the midpoints 317 of the apertures 315 can have exemplary values of 5 micrometers, 100 micrometers and 200 micrometers. The diameters D of the apertures 315 are smaller than the pitch $P_3$ between the midpoints of the apertures. Exemplary values of the diameters D are $0.2 \times P_3$, $0.4 \times P_3$ and $0.8 \times P_3$.

Particles of the illuminating particle beam 311 pass through the apertures 315 and form particle beams 3. Particles of the illuminating beam 311 which strike the plate 313 are absorbed by the latter and do not contribute to the formation of the particle beams 3.

On account of an applied electrostatic field, the multi-aperture arrangement 305 focuses each of the particle beams 3 in such a way that beam foci 323 are formed in a plane 325. Alternatively, the beam foci 323 can be virtual. A diameter of the beam foci 323 can be, for example, 10 nanometers, 100 nanometers and 1 micrometer.

The field lens 307 and the objective lens 102 provide a first imaging particle optical unit for imaging the plane 325, in which the beam foci 323 are formed, onto the first plane 101 such that a field 103 of locations of incidence 5 or beam spots arises there. Should a surface of the object 7 be arranged in the first plane, the beam spots are correspondingly formed on the object surface.

The objective lens 102 and the projection lens arrangement 205 provide a second imaging particle optical unit for imaging the first plane 101 onto the detection plane 211. The objective lens 102 is thus a lens that is part of both the first and the second particle optical unit, while the field lens 307 belongs only to the first particle optical unit and the projection lens 205 belongs only to the second particle optical unit.

A beam switch 400 is arranged in the beam path of the first particle optical unit between the multi-aperture arrangement 305 and the objective lens system 100. The beam switch 400 is also part of the second optical unit in the beam path between the objective lens system 100 and the detector system 200.

Further information relating to such multi-beam particle beam systems and components used therein, such as, for instance, particle sources, multi-aperture plate and lenses, can be obtained from the international patent applications WO 2005/024881 A2, WO 2007/028595 A2, WO 2007/028596 A1, WO 2011/124352 A1 and WO 2007/060017 A2 and the German patent applications DE 10 2013 026 113 A1 and DE 10 2013 014 976 A1, the disclosure of which in the full scope thereof is incorporated by reference in the present application.

The multiple particle beam system furthermore comprises a computer system 10 configured both for controlling the individual particle optical components of the multiple particle beam system and for evaluating and analyzing the signals obtained by the multi-detector 209. In this case, the computer system 10 can be constructed from a plurality of individual computers or components. It can also contain the controller according to the disclosure.

Figure 2:
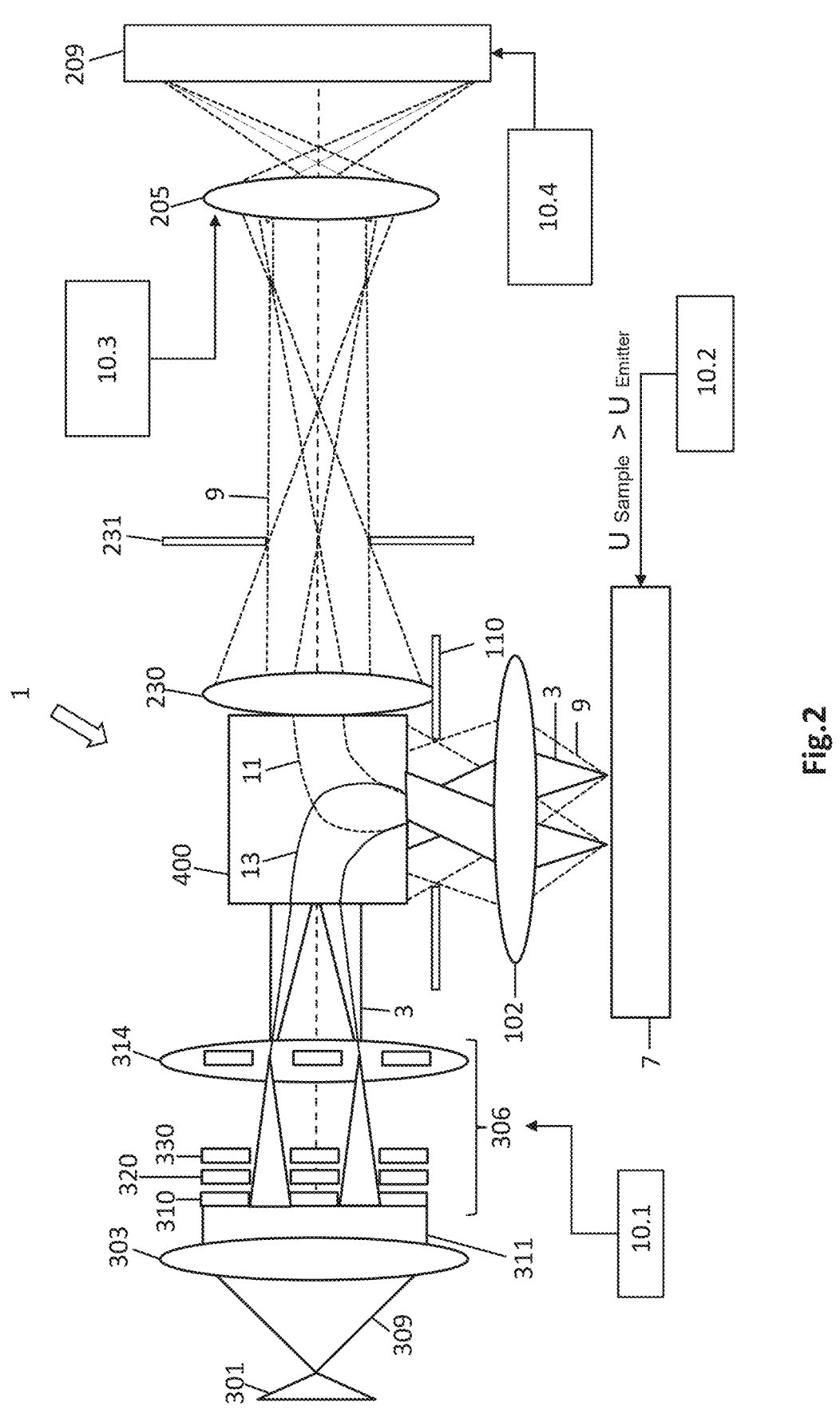
FIG. 2: shows a schematic illustration of a multiple particle beam system in the normal mode of operation.

FIG. 2 shows a schematic illustration of a multiple particle beam system 1 in the normal mode of operation. In the normal mode of operation, a multiplicity of charged individual particle beams 3 are generated, the latter being incident on a sample 7 and releasing interaction particles there. In the example shown, the individual particle beams are electron beams and the interaction particles emanating from the sample 7 are secondary electrons or second individual particle beams 9. Both the primary particle beam path 13 and the secondary particle beam path 11, as well as the associated individual particle beams 3 and 9, respectively, are plotted in FIG. 2. To aid distinguishability, the first individual particle beams 3 are illustrated here via full lines and the second individual particle beams 9 are illustrated via dashed lines. In this case, only second individual particle beams 9 are incident on the detection system, which is operated in the first detection mode and which is illustrated here as first detection unit 209 in exemplary fashion.

A divergent electron beam is emitted from the particle source 301. It is collimated via the collimation lens system 303 to form an illuminating particle beam 311. The latter subsequently strikes a micro-optical unit 306. The micro-optical unit 306 is connected to a first control unit 10.1 of the computer system 10. In the example shown, the micro-optical unit 306 comprises a plurality of components. This includes initially the multi-beam generator 310 (only illustrated schematically), the multi-stigmator 320 and the multi-focus correction mechanism 330. Moreover, a multi-field lens 314 is part of the micro-optical unit 306 in the example shown. However, it is also possible for the micro-optical unit 306 to be constructed differently. However, it is important for the latter to comprise the multi-beam generator 310. By way of example, the latter can comprise a multi-lens array with a multi-aperture plate and with a counter electrode. In addition or as an alternative thereto, the multi-generator 310 can comprise a multi-aperture plate and a multi-deflector array. The multi-beam generator 310 or the micro-optical unit 306 is used to generate a first field of a multiplicity of charged individual particle beams 3, in this case electron beams 3, which subsequently pass through a beam switch 400, go through an aperture 110 and are subsequently imaged in focus on a sample 7 after passing through an objective lens 102. In the process, the locations of incidence on the sample 7 form a second field. The objective lens 102 can be a single objective lens or an objective lens system. Optionally, this is a magnetic objective lens 102. However, other embodiments are also possible.

Typically, the first electron beams 3 are incident on the sample 7 with a landing energy of between approximately 150 eV and 3000 eV. To this end, for example, the potential of the sample is set by way of the second control unit 10.2 of the computer system 10 to a first potential $U_{Sample} > U_{Emitter}$. As a result, secondary electron beams 9 are released from the sample 7 and pass through the objective lens 102 in turn. Subsequently they pass through the aperture 110 and the beam switch 400. After leaving the latter, the second particle beams 9 pass through a contrast lens 230 or a contrast lens system 230 with an associated contrast aperture 231. Then, they strike a projection lens system 205, by which the second particle beams 9 are imaged in focus on the detection system in the first detection mode or on the first detection unit 209. The detection system in the first detection mode or the first detection unit 209 in this case represents a particle multi-detector. The detection system 209 is controlled by way of a fourth control unit 10.4. Intensity levels of the second election beams 9 are assigned to locations of incidence on the sample 7 and an image of the sample 7 is generated by subsequent evaluation of the measured electron beam intensity levels.

Figure 3:
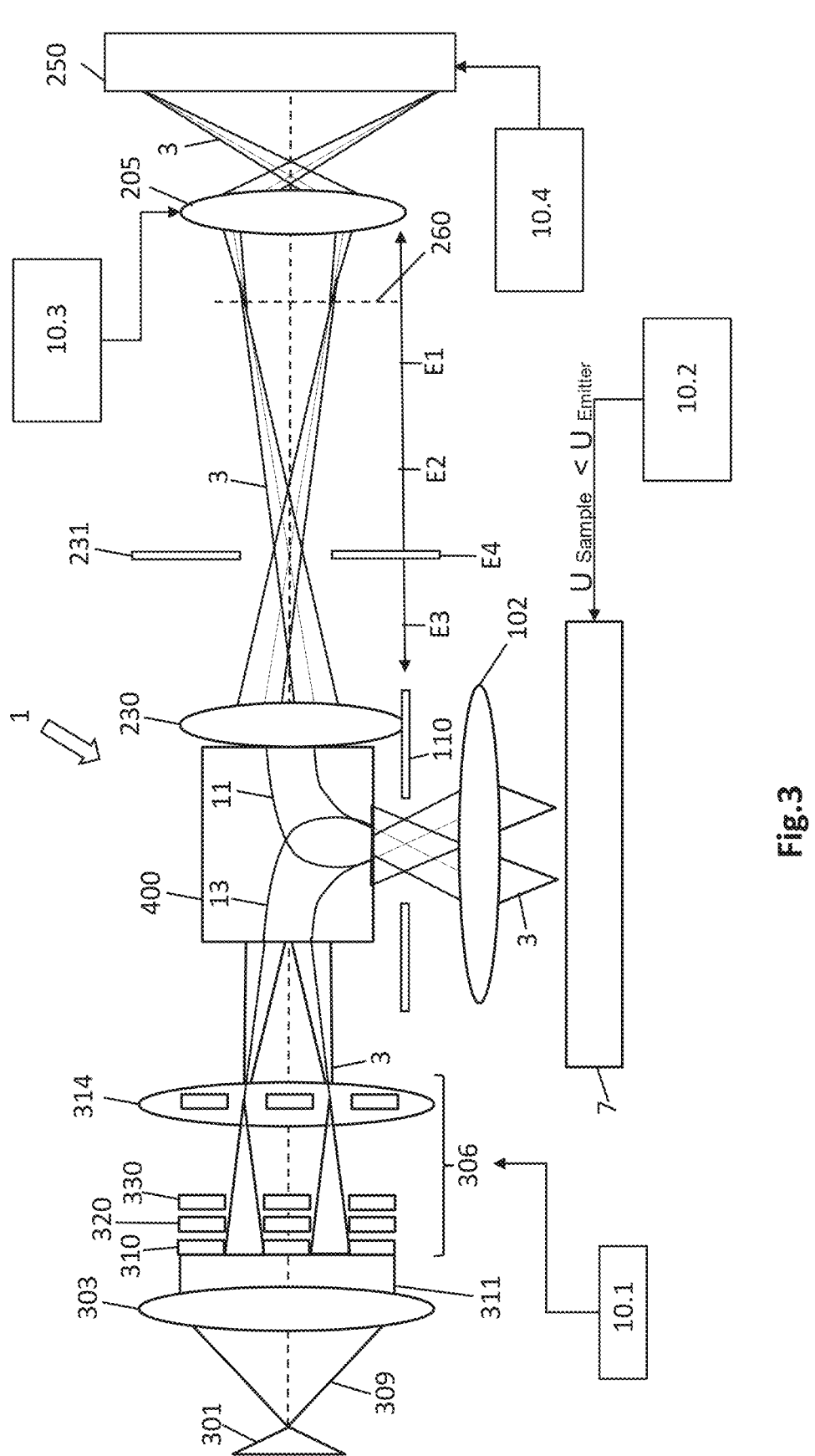
FIG. 3: shows a schematic illustration of a multiple particle beam system in the pupil observation mirror mode of operation.

FIG. 3 shows a schematic illustration of a multiple particle beam system in the pupil observation mirror mode of operation. Unlike the normal mode of operation illustrated in FIG. 2, what applies to the pupil observation mirror mode of operation illustrated in FIG. 3 is that the potential at the sample 7 is smaller than the potential at the emitter 301. To this end, for example, the potential of the sample is set by way of the second control unit 10.2 of the computer system 10 to a second potential $U_{sample} < U_{Emitter}$. This leads to the individual particle beams 3 generated via the multi-beam generator 310 or via the micro-optical unit 306 not being incident on the sample 7 but reversing or being reflected in front of the sample 7. In a desirable case, the first individual particle beams 3 reverse just in front of the surface of the sample 7. This is because in this case the settings of the micro-optical unit 306 via the control unit 10.1, for example of the multi-beam generator 310, are unchanged in comparison with the normal mode of operation. The remaining settings of the first particle optical unit which direct the individual particle beams 3 in the direction of the sample 7 can also be left substantially unchanged. By way of example, a potential difference between the emitter 301 and the surface of the sample 7 is approximately 30 eV, 40 eV or 50 eV.

Unlike in the normal mode of operation as per FIG. 2, the second particle optical unit with the second particle optical beam path 11 is now penetrated by the reflected electron beams as second individual particle beams 3 in the pupil observation mirror mode of operation. In FIG. 3, this is also illustrated by virtue of the illustrated individual particle beams 3 being illustrated as solid rays even in the region of the second particle optical unit. Only the optical axis of the system is plotted using dashed lines. Now, the detection system is operated in the second detection mode, illustrated here by the reference sign 250. In the example shown, the second individual particle beams 3 are imaged on the second detection unit 250. In this case, the second detection unit 250 can physically differ from the first detection unit 209. However, it is also possible for a distinction between the first detection mode and the second detection mode to be achieved purely by the controller 10 controlling the detection system differently. What is important is that the detection system is configured to generate a two-dimensional image in the second detection mode. Thus, all incident individual particle beams 3 are detected, for example detected simultaneously, in the second detection mode or via the second detection unit 250. A real two-dimensional image arises. By way of example, the second detection unit 250 can be a CCD camera. However, other embodiments of the second detection unit 250 are also possible.

Operating the multiple particle beam system 1 in the pupil observation mirror mode of operation makes it possible to inspect or check the functionality of the multi-generator 310 or of the micro-optical unit 306 overall. Here, it can be the case that the controller 10 of the multiple particle beam system 1 is configured so that the control of the second particle optical unit via a third control unit 10.3 is varied in the pupil observation mirror mode of operation. In addition to the objective lens system 102, the second particle optical unit comprises, for example, the contrast lens system 230 and the projection lens system 205. In this case, the projection lens system 205 can be constructed from a plurality of projection lenses. According to one embodiment variant, the projection lens system comprises exactly two projection lenses; however, it could also comprise three, four or more projection lenses. One of the projection lenses of the projection lens system 205 substantially serves here to set a magnification during the imaging in the second detection mode or on the second detection unit 250, another projection lens substantially serves to set a focus during the imaging. Here, the projection lenses of the projection lens system 205 are typically operated at a few 100 mA and up to approximately at most 200 A. Here, the lenses of the projection lens system 205 are controlled by the control unit 10.3 of the controller 10 according to the disclosure. Depending on how the lenses are controlled, an observation plane 260 in the second particle optical beam path can be displaced. Optionally, the control of the projection lens system 205 is varied step-by-step in the pupil observation mirror mode of operation and a recording is taken in each step within the scope of the second detection mode or via the second detection unit 250.

The displaceable observation plane 260 allows the second individual particle beams 3 to be imaged at different positions of the second particle optical unit. Planes E1, E2 and E3 are plotted in exemplary fashion in FIG. 3. The associated images which have been recorded via the second detection unit 250 are illustrated in FIGS. 4a), b), c) and d).

Figure 4:
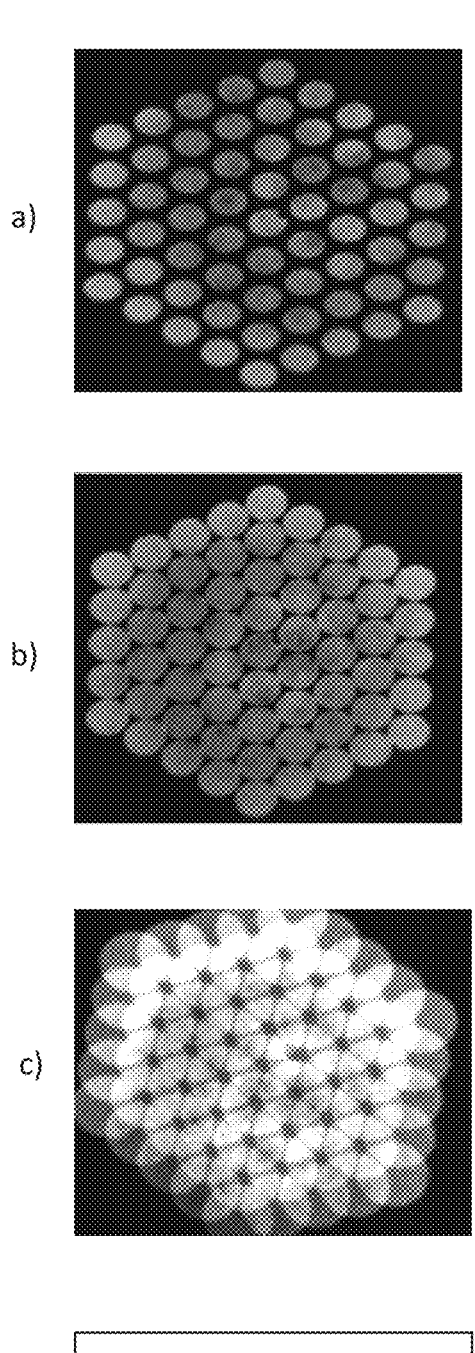
FIG. 4: shows recordings of various observation planes via a detection system in the second detection mode.
Figure 4:
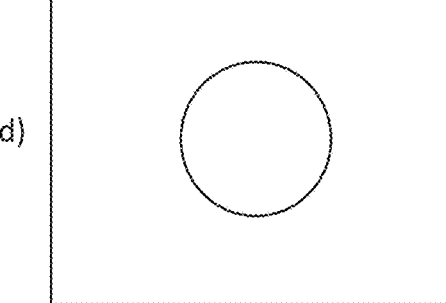

If the imaging is implemented by a first control of the projection lens system 205 by the controller 10 according to the disclosure in the plane E1, the image shown in FIG. 4a) is obtained. In this case, the plane E1 corresponds to an intermediate plane which is conjugate to near field planes of the multiple particle beam system 1. In this case, the individual particle beams are clearly separated from one another in FIG. 4a) and the respective diameter of the individual particle beams can easily be identified. For example, it is possible to identify that a central individual particle beam has a cutout and hence a deviation from the ideal circular beam diameter.

If the imaging is implemented by a second control of the projection lens system 205 by the controller 10 according to the disclosure in the plane E2, the image shown in FIG. 4b) is obtained. Here, the single individual particle beams 3 are in contact with one another and deviations from the optimum beam diameter are likewise identifiable.

An image representation of the plane E3 as a result of a third control of the projection lens system 205 by the controller 10 according to the disclosure is illustrated in FIG. 4c). Here, the plane E3 corresponds to an intermediate plane between a near field plane and a pupil plane of the multiple particle beam system 1. In this case, the individual particle beams are still superposed.

By way of a fourth control of the projection lens system 205 by way of the controller 10 according to the disclosure, the contrast aperture 231 is imaged on the detection unit 209 or 250. This is illustrated in FIG. 4d). The plane E4 of the contrast aperture 231 in this case corresponds to a pupil plane of the multiple particle beam system 1.

The recordings made, which can be assigned for example to different planes E1, E2, E3 and E4, can be analyzed when zooming through the second particle optical unit and it is possible to identify malfunctions of the multi-beam generator 310 or of other components of the micro-optical unit 306. For example, it is possible to determine whether there are charge accumulations on the multi-beam generator 310.

Figure 5:
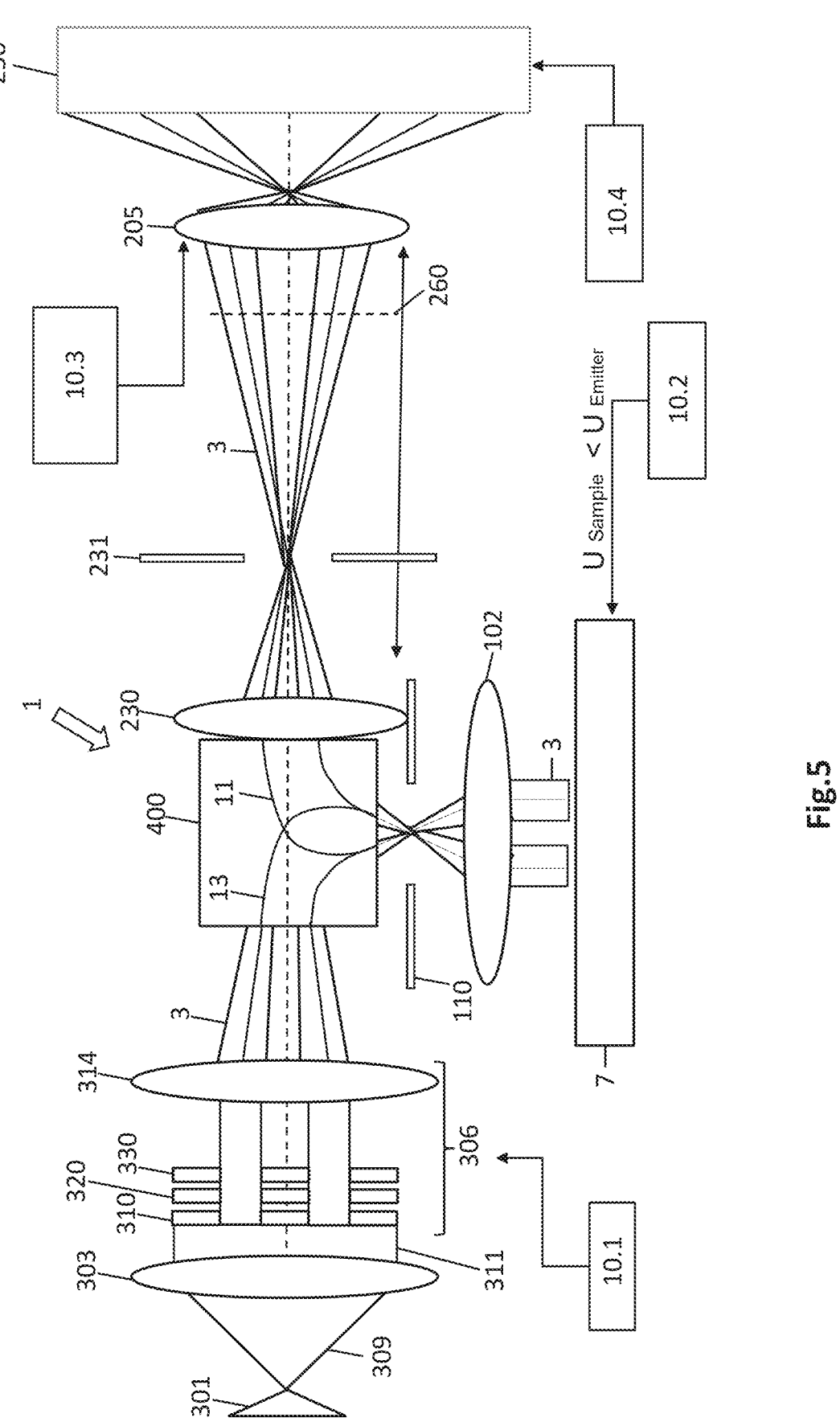
FIG. 5: shows a schematic illustration of a multiple particle beam system in the shadow mirror mode of operation.

FIG. 5 shows a schematic illustration of a multiple particle beam system 1 in the shadow mirror mode of operation. The shadow mirror mode of operation is a further mirror mode of operation. What applies to this mode is that, once again, the potential U at the sample 7 is smaller than the potential U at the emitter 301. However, in this case the controller 10 is configured in such a way that, in the shadow mirror mode of operation, the multi-beam generator 310 is switched off. Thus, first individual particle beams 3 are generated by the multi-beam generator 310, but these are not focused and instead form planar particle beams. The first particle optical beam path 13 changes as a result of the multi-beam generator 310 being switched off. To still be directed in the direction of the sample 7 or to still pass the beam switch 400 and apertures situated in the first particle optical beam path, it is therefore desirable to differently set other particle optical components in the first particle optical beam path. Therefore, the controller 10 can be configured to control the global lens system of the first particle optical unit in such a way that the individual particle beams 3 substantially pass through the beam switch 400 and global apertures, e.g., the aperture 110. Then, planar first individual particle beams 3 are decelerated and reflected just in front of the surface of the sample 7. These planar reflected second individual particle beams 3 then also pass through the second particle optical unit and are subsequently imaged in two dimensions via the detection system in the second detection mode 250. In this shadow mirror mode of operation, it is also possible to vary the control of the second particle optical unit and, for example, the control of the projection lens system 305 step-by-step and, for example, carry out a recording via the detection system in the second detection mode 250 in each step.

Figure 6:
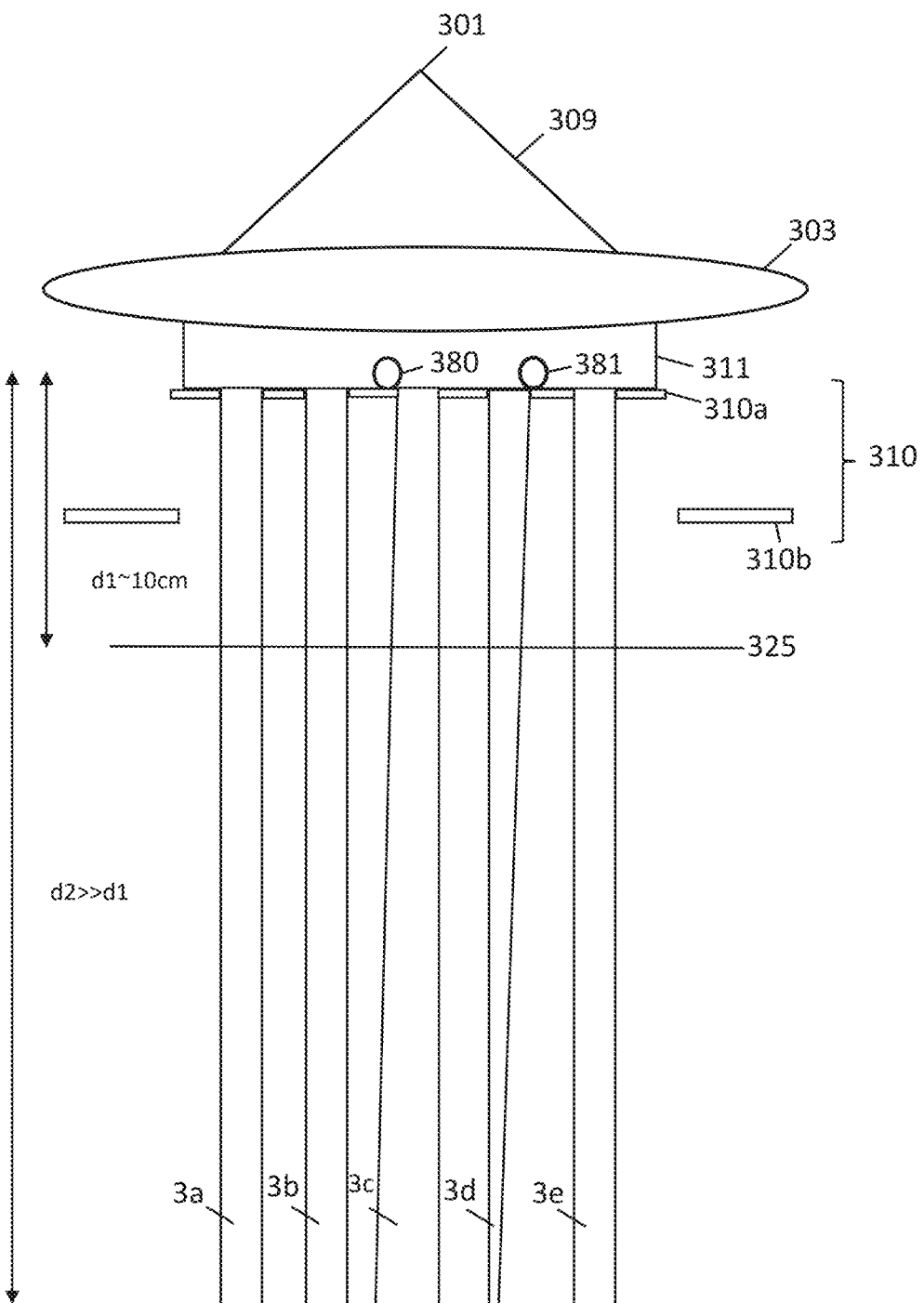
FIG. 6: illustrates beam paths in the shadow mirror mode of operation.

The strengths of the shadow mirror mode of operation are illustrated in FIG. 6: FIG. 6 illustrates beam paths in the shadow mirror mode of operation. A divergent particle beam 309 emanates from the particle source 301, the particle beam subsequently passing through the collimation lens system 303 and being collimated. The illuminating particle beam 311, which is a bundle aligned in parallel in this case, then is incident on the multi-beam generator 310 with a multi-aperture plate. The multi-beam generator 310 is switched off in the illustrated shadow mirror mode of operation. This means that the individual particles, electrons in this case, only pass through the openings of the multi-aperture plate 310a, the counter electrode 310b is switched off.

FIG. 6 illustrates the case where charge accumulations 380 and 381 are present on the multi-beam generator 310, more precisely on the multi-aperture plate 310a. The charge accumulation 380 is an accumulation of positive charge, the charge accumulation 381 is an accumulation of negative charge. The charge accumulations have an influence on the individual particle beams 3 formed in the region of the respective openings: The first individual particle beam 3a passes through the multi-aperture plate 310a without charge accumulations being present at the associated opening. The individual particle beam 3a therefore has a circular beam diameter and the outer rays run parallel to one another. The same applies to the individual particle beam 3b. However, the situation is different for the individual particle beam 3c: Here, the accumulation of positive charge 380 is situated at the associated opening in the multi-aperture plate 310. This leads to the edge of the individual particle beam 3c being deflected in the direction of the charge accumulation. Thus, the associated individual particle beam 3c is expanded on one side. The converse case applies to the particle beam 3d: The accumulation of negative charge 381 ensures that the right side of the individual particle beam 3d is deflected away from the charge accumulation 381. Thus, an obliquely convergent individual particle beam 3d is obtained instead of a parallel individual particle beam 3d. By contrast, the individual particle beam 3e is once again non-deflected in an ideal fashion.

The shown effects caused by unwanted charge accumulations 380 and 381 are generally very small. However, even these small effects can be made easily visible if the shadow mirror mode of operation is used. They become ever clearer the longer the drift path is for the individual particle beams 3a, 3b, 3c, 3d and 3e. The drift path d2 and the distance d1 are plotted in exemplary fashion in FIG. 6; d1 is typically approximately 10 cm and the real foci of the individual particle beams 3 normally lie in the plotted intermediate image plane 325 when the multi-beam generator 310 is switched on.

Moreover, the functionality of the multi-stigmator 320 and/or of the multi-focus correction mechanism 330 can be tested in a targeted fashion in the shadow mirror mode of operation. To this end, the controller 10 is configured in such a way that, in the mirror mode of operation, the multi-stigmator 320 and/or the multi-focus correction mechanism 330 is switched on. Both the multi-stigmator 320 and the multi-focus correction mechanism 330 cause only small deflections of the individual particle beams 3. Whether these deflections are of the desired form can easily be verified via the shadow mirror mode of operation.

The detector observation mirror mode of operation represents a further mirror mode of operation. It is very similar to the pupil observation mirror mode of operation. However, the mirror electrons are detected not in the second detection mode but in the first detection mode. In this case, the controller can be configured in such a way that the second individual particle beams 3 are guided over the detection system in the mirror mode of operation such that a scan image of the detection system is generated in the first detection mode. Thus, this mirror mode of operation can be used to check or verify the functionality of the detection regions of the detection system. Moreover, individual beam current measurements can be carried out.

It is normally the case during the normal operation of a multiple particle beam system 1 that the second individual particle beams are incident substantially at a fixed location and in telecentric fashion on the detection regions of the third field as a result of using scan deflectors. The intensity levels of the incident second individual particle beams are then related to the sample surface or the topology thereof. By contrast, the interaction with the sample 7 is eliminated in the detector observation mirror mode of operation. By switching off scan deflectors or by an alternative control of the scan deflectors via the controller 10, the reflected second individual particle beams 3 are guided over the detection system in the first detection mode. Thus, multiple images arise in each detection region since each of the second individual particle beams 3 is imaged on the detection region.

Alternatively, it is possible that a position of the second individual particle beams 3 on the detection system 209 is kept constant in the detector observation mirror mode of operation so that it is possible to carry out a detection quantum efficiency analysis for the detection regions of the detection system 209. Statistical noise is expected in this mode of operation. If this is not the case, individual detection regions, for example, can be set differently or can be replaced.

Figure 7:
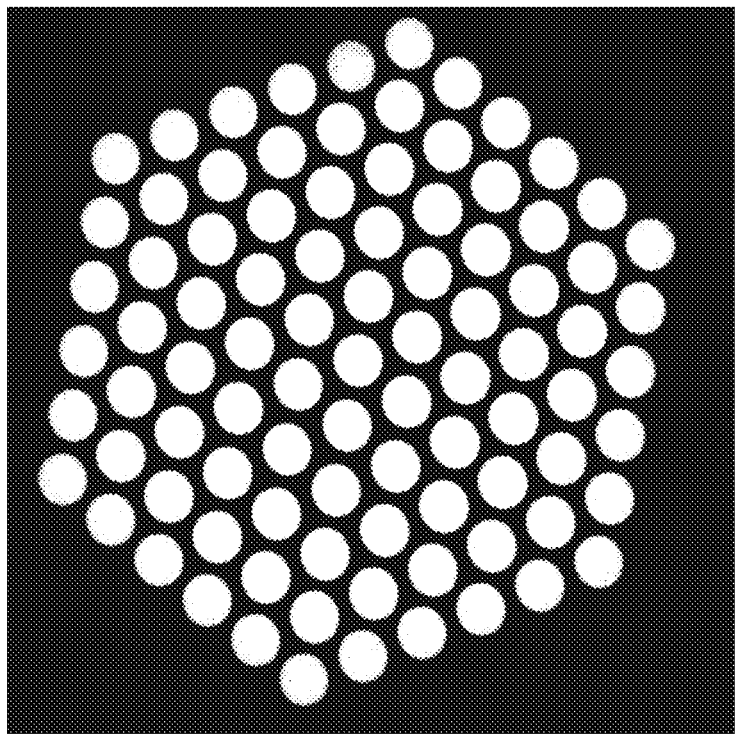
FIG. 7: shows a scan image of a single detection region, which has been recorded in the detector observation mirror mode of operation via the detection system in the first detection mode.

FIG. 7 shows a scan image of a single detection region, which has been recorded in the detector observation mirror mode of operation via the detection system in the first detection mode 209. By way of example, the homogeneity of a detection region can be checked by such a recording. It is possible to identify defects in the detection region or else possible to determine whether there is crosstalk between individual detection regions.

Figure 8:
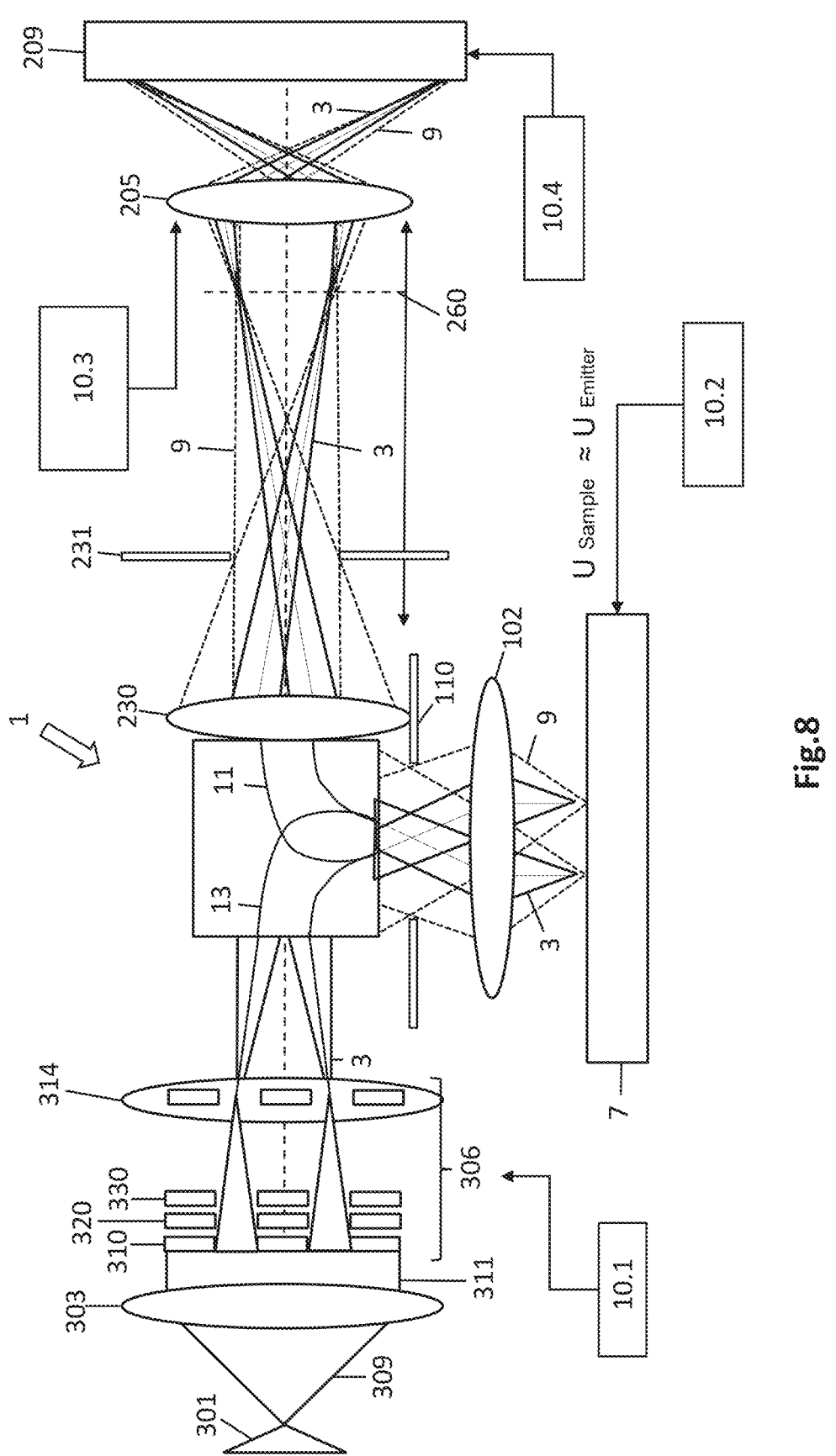
FIG. 8: shows a schematic illustration of a multiple particle beam system in the charge control mirror mode of operation.

FIG. 8 shows a schematic illustration of a multiple particle beam system 1 in the charge control mirror mode of operation. Unlike in the other mirror modes of operation, the potential at the sample approximately corresponds to the potential at the emitter. As a consequence, at least some of the first individual particle beams are not incident on the sample but are reflected as second individual particle beams. By contrast, other individual particle beams are incident on the sample 7 and release secondary particles or second individual particle beams 9 at the locations of incidence. Therefore, it is evident in FIG. 8 that both reflected individual particle beams 3 and newly released second individual particle beams 9 make a contribution in the secondary beam path 11 to the signal detected via the detection system in the first detection mode 209. In the example shown, the first individual particle beams 3 are incident in focus on the surface of the sample 7, if they are incident at all. However, it would alternatively also be possible to use defocused and, for example, plane particle beams to this end. This depends on the intended use in the individual case.

According to one embodiment, the controller 10 is configured in such a way that there is such alternating between the charge control mirror mode of operation and the normal mode of operation that, in the charge control mirror mode of operation, local charges on the sample 7 are generated or compensated. Alternating between the two modes therefore ensures that images with a high quality and resolution can be obtained in the normal mode of operation. Thus, the picture does not run away because increasing charge accumulations of the sample 7 make further image recording more difficult. In the case of a corresponding setting in the charge control mirror mode of operation it is even the case that individual particle beams 3 switch off independently, i.e., transition from incidence on the sample to the reflection in front of the sample 7 as soon as the desired charge state is achieved at a location on the sample 7. This is due to the fact that the charge control mirror mode of operation is very sensitive in respect of charge accumulations on the sample surface. Therefore, the charge control mirror mode of operation is also suitable for monitoring or testing charge states on the sample 7. This includes, for example, switching states of circuits.

In the example illustrated in FIG. 8, the second individual particle beams 3 and 9 are detected via the detection system in the first detection mode 209. However, it would also be additionally or alternatively possible in this mode of operation to carry out a detection via the detection system in the second detection mode 250. Finally, it is also an option to dispense with particle detection overall in the charge control mirror mode of operation. In this case, the interest is directed purely to the scans in the normal mode of operation of the multiple particle beam system 1.

Figure 9:
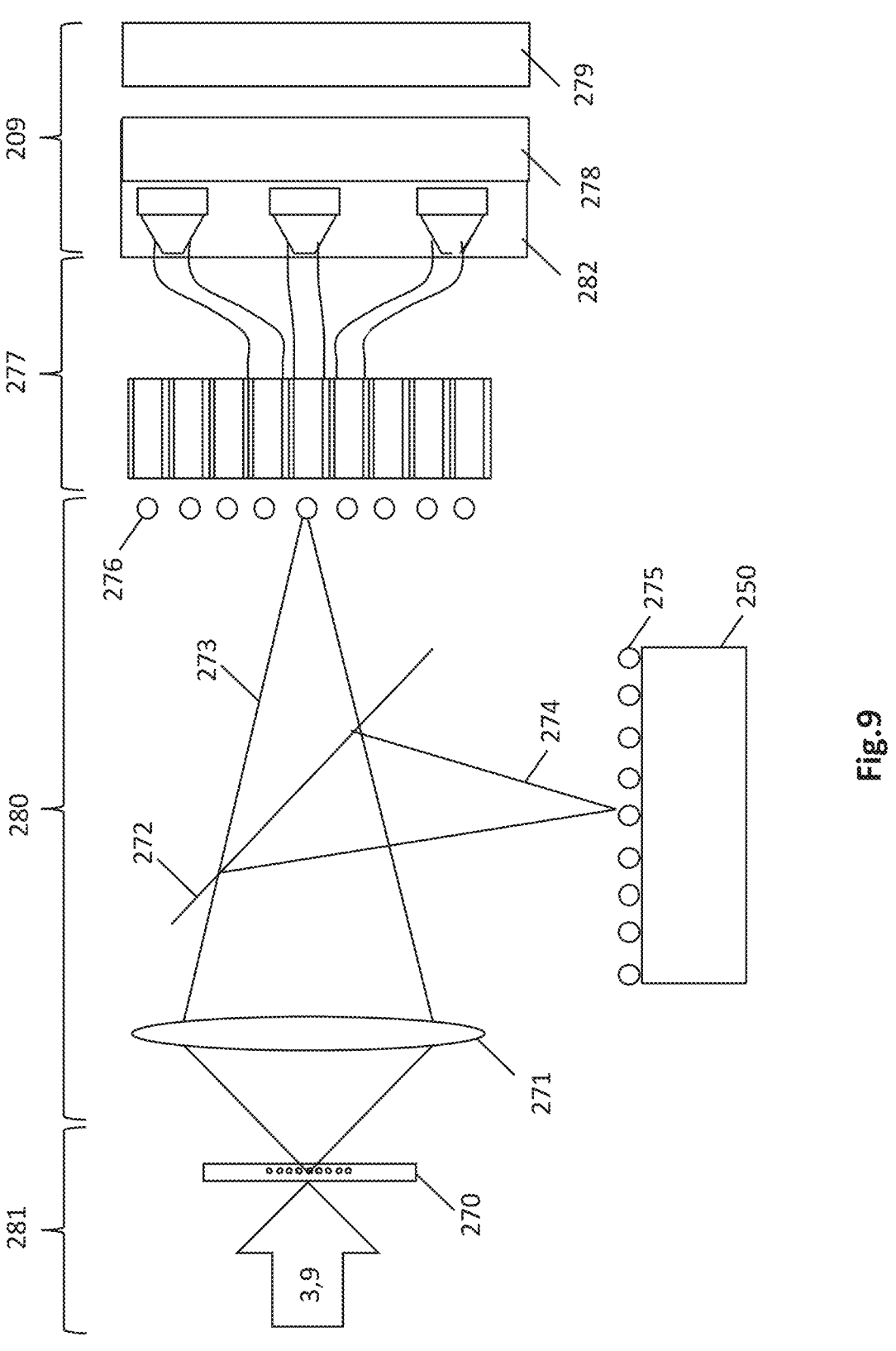
FIG. 9: shows in exemplary fashion and in a schematic illustration a detection system with a first detection unit and a second detection unit.

FIG. 9 shows, in a schematic illustration, an example of a detection system with a first detection unit 209 and with a second detection unit 250. In this case, both the first detection unit 209 and the second detection unit 250 comprise both a particle detection unit and a light detection unit. The particle detection unit is identical in the example shown: The secondary individual particle beams 3 and/or 9 are incident on a scintillator 270 after passing through the particle beam system column 281. They are subsequently imaged via the detector optical unit 280 and the signals are subsequently processed further. In the example shown, the detector optical unit 280 specifically comprises a light-optical lens 271, which images the light emitted by the scintillator plate 270 after incidence of the particles on the scintillator 270. In this case, light beams 273 strike optical fiber bundles 277 at points of incidence 276. These optical fiber bundles 277 transport electric signals to lights detectors 282, the electric signals of which are amplified via an amplifier 278 and converted into a digital signal in the digitizer 279, for example via a camera link. In the example shown, the first detection unit 209 can comprise an avalanche photodiode 282, for example.

A beam splitter 272 is arranged in the light-optical beam path in the example shown in FIG. 9. Using this, a light beam 274 is directed at points of incidence 275 of the second detection unit 250. By way of example, the second detection unit 250 can comprise a CCD camera in this case. Other configurations of the first detection unit 209 and of the second detection unit 250 are also possible as a matter of principle. The two detection units 209, 250 can be operated individually in each case or else simultaneously. This makes it easy to change between the modes of operation of the multiple particle beam system, which each place different desired performance properties on the detection units 209, 250.

The first detection unit 209 can also be designed as a CMOS or CCD sensor, comparable to a detector array. In this case, the detector array can either detect electron beams directly or can comprise a scintillator which converts the incident electron beams into light. In this case, the first detection unit 209 and the second detection unit 250 can be identical.

FIG. 10 shows in a table options for controlling the multiple particle beam system 1. The computer system or the controller 10 comprises four control units 10.1, 10.2, 10.3, 10.4 in the example shown. However, the controller 10 can also comprise more control units. In this case, the control unit 10.1 controls the multi-beam generator 310 and hence at least a part of the micro-optical unit 306. However, it can also control the entire micro-optical unit 306, for example including a multi-stigmator 320 and a multi-focus correction mechanism 330. The control unit 10.2 controls the sample region voltage supply at the sample 7. The control unit 10.3 controls the second particle optical unit and, for example, the projection lens system 205. It is also possible for the control unit 10.3 to control the objective lens system 102, which is likewise part of the second particle optical unit. The control unit 10.4 controls the detection system 209, 250, wherein the detection system 209, 250 can be controlled in a first detection mode 209 and in a second detection mode 250.

The following relation applies in a normal mode of operation: $U_{Sample} > U_{Emitter}$. The multi-beam generator 310 is switched on, the second particle optical unit is switched on and the detection system is operated in a first detection mode 209.

The following relation applies in the pupil observation mirror mode of operation: $U_{Sample} < U_{Emitter}$. Here, the multi-beam generator 310 is switched on, the second particle optical unit is switched on and the detection system is operated in the second detection mode 250.

The following relation applies in the shadow mirror mode of operation: $U_{Sample} < U_{Emitter}$. The multi-beam generator 310 is switched off. The second particle optical unit is switched on and the detection system is operated in the second detection mode 250.

The following relation applies in the detector observation mirror mode of operation: $U_{Sample} < U_{Emitter}$. Here, the multi-beam generator 310 is switched on and the second particle optical unit is switched on. The detection system is operated in the first detection mode 209.

The following relationship applies in the charge control mirror mode of operation: $U_{Sample} \approx U_{Emitter}$. Here, the multi-beam generator 310 is either switched on or switched off. The second particle optical unit is switched on. The detection system can be switched off. However, it can also be operated in the first detection mode 209 and/or in the second detection mode 250.

According to an embodiment of the disclosure, the multiple particle beam system comprises at least one operating element such as, for example, an operating field or a switch such that a user can select or set as the mode of operation the normal mode of operation, the pupil observation mirror mode of operation, the shadow mirror mode of operation, the detector observation mirror mode of operation and/or the charge control mirror mode of operation.

LIST OF REFERENCE SIGNS

1 Multi-beam particle microscope
3 Primary particle beams (individual particle beams)
5 Beam spots, locations of incidence
7 Object
8 Sample stage
9 Secondary particle beams
10 Computer system, controller
11 Secondary particle beam path
13 Primary particle beam path
100 Objective lens system
101 Object plane
102 Objective lens
103 Field
110 Aperture
200 Detector system
205 Projection lens
207 Detection region
209 Particle multi-detector, detection system in the first detection mode, first detection unit
211 Detection plane
213 Locations of incidence
215 Detection region
217 Field
230 Contrast lens
231 Contrast aperture
250 Detection system in the second detection mode, second detection unit for two-dimensional image, CCD camera
260 Displaceable observation plane
270 Scintillator
271 Light-optical lens
272 Beam splitter
273 Light ray
274 Light ray
275 Points of incidence
276 Points of incidence
277 Optical fiber bundle 278 Electronic amplifier
279 Digitizer
280 Detector optical unit
281 MultiSEM column
282 Avalanche photodiode
300 Beam generation apparatus
301 Particle source
303 Collimation lens system
305 Multi-aperture arrangement
306 Micro-optical unit
307 Field lens system
309 Diverging particle beam
310 Multi-beam generator
311 Illuminating particle beam
313 Multi-aperture plate
314 Multi-field lens
315 Openings in the multi-aperture plate
317 Midpoints of the openings
319 Field
320 Multi-stigmator
323 Beam foci
325 Intermediate image plane
330 Multi-focus correction mechanism
380 Accumulation of positive charge
381 Accumulation of negative charge
400 Beam switch

What is claimed is:

1. A multiple particle beam system, comprising:
a particle source configured to generate a first charged particle beam;
a micro-optical unit comprising a multi-beam generator, the micro-optical unit configured to generate a first field of a multiplicity of charged individual particle beams from the first charged particle beam;
a first particle optical unit having a first particle optical beam path, the first particle optical unit configured to direct the individual particle beams at a sample and/or in a direction of a sample so that the first particle beams strike the sample at locations of incidence and/or reach reversal locations upstream of the sample to define a second field;
a detection system;
a second particle optical unit having a second particle optical beam path, the second particle optical unit configured to image second individual particle beams onto the detection system, the second individual particle beams emanating from: i) the locations of incidence in the second field onto the detection system; or ii) the reversal locations in the second field;
a particle optical objective lens configured so that the first and second individual particle beams pass therethrough;
a beam switch in the first particle optical beam path between the multi-beam particle source and the objective lens, the beam switch being in the second particle optical beam path between the objective lens and the detection system;
a sample region voltage supply configured to provide an adjustable sample region voltage in the sample region; and
a controller configured to control the micro-optical unit, the particle optical objective lens, the first particle optical unit, the second particle optical unit, the detection system and the sample region voltage supply,
wherein:
the detection system has first and second detection modes;

in the first detection mode, the second individual particle beams are imaged on detection regions of the detection system which form a third field;
in the second mode, a two-dimensional image is generated;
the controller is configured to provide a normal mode of operation and a mirror mode of operation;
in the normal mode of operation, the detection system is operated in the first detection mode;
in the normal mode of operation, the sample region voltage is set so that the first individual particle beams are incident on the sample and release from the sample a multiplicity of secondary particles in the form of second individual particle beams, the secondary particles being imaged on the detection system after passing through the second particle optical unit;
in the mirror mode of operation, the detection system is operated in the first and/or in the second detection mode; and
in the mirror mode of operation, the sample region voltage is set so that at least some of the first individual particle beams are not incident on the sample but are reflected as second individual particle beams, the second individual particle beams being imaged on the detection system after passing through the second particle optical unit, and
wherein:
the detection system is operable in the second detection mode in the mirror mode of operation;
in the mirror mode of operation, the sample region voltage is settable via the controller so that the first individual particle beams are not incident on the sample but are reflected as second individual particle beams;
in the mirror mode of operation, the second individual particle beams are imageable on the detection system after passing through the second particle optical unit; and
the controller is configured so that, in the mirror mode of operation, the multi-beam generator is switched off.

2. The multiple particle beam system of claim 1, wherein the sample region voltage supply is configured to apply a variable voltage to a sample stage on which the sample is placed.

3. The multiple particle beam system of claim 1, wherein the controller is configured so that the multiple particle beam system alternates between the normal mode of operation and the mirror mode of operation.

4. The multiple particle beam system of claim 1, wherein the detection system is configured to achieve the first and second detection modes based exclusively on different controls of the detection system by the controller.

5. The multiple particle beam system of claim 1, wherein the detection system comprises first and second detection units, the first detection unit is controlled by the controller in the first detection mode, and the second detection unit is controlled by the controller in the second detection mode.

6. The multiple particle beam system of claim 5, wherein at least one of the following holds:
the first detection unit comprises a particle detection unit and a light detection unit; and
the second detection unit comprises a particle detection unit and a light detection unit.

7. The multiple particle beam system of claim 5, wherein at least one of the following holds:

the first detection unit comprises an avalanche photo-diode; and the second detection unit comprises a CCD camera.

8. The multiple particle beam system of claim 1, wherein the micro-optical unit comprises at least one member selected from the group consisting of:

the multi-beam generator;

a multi-stigmator configured to individually adjust a stigmation of the first individual particle beams via the controller; and a multi-focus correction mechanism configured to individually correct a focus of the first individual particle beams via the controller.

9. The multiple particle beam system of claim 1, wherein the multi-beam generator comprises a multi-lens array with a multi-aperture plate and with a counter electrode.

10. The multiple particle beam system of claim 1, wherein the multi-beam generator comprises a multi-aperture plate and a multi-deflector array.

11. The multiple particle beam system of claim 1, wherein the first particle optical unit comprises a global lens system.

12. The multiple particle beam system of claim 1, wherein the second particle optical unit comprises a projection lens system.

13. The multiple particle beam system of claim 1, wherein the controller is configured in so a way that, in the normal mode of operation and in the mirror mode of operation, the multi-beam generator is controllable in the same way.

14. The multiple particle beam system of claim 1, wherein the controller is configured in such a way that the control of the second particle optical unit is variable in the mirror mode of operation.

15. The multiple particle beam system of claim 1, wherein the controller is configured so that the control of the second particle optical unit is variable step-by-step in the mirror mode of operation, and the detection system is configured to make a recording in in each step.

16. The multiple particle beam system of claim 1, wherein the sample region voltage supply is configured to apply a variable voltage to a sample stage on which the sample is placed, and the controller is configured so that the multiple particle beam system alternates between the normal mode of operation and the mirror mode of operation.

17. The multiple particle beam system of claim 16, wherein the detection system is configured to achieve the first and second detection modes based exclusively on different controls of the detection system by the controller.

18. The multiple particle beam system of claim 17, wherein the detection system comprises first and second detection units, the first detection unit is controlled by the controller in the first detection mode, and the second detection unit is controlled by the controller in the second detection mode.

19. The multiple particle beam system of claim 1, wherein the sample region voltage supply is configured to apply a variable voltage to a sample stage on which the sample is placed, and the detection system is configured to achieve the first and second detection modes based exclusively on different controls of the detection system by the controller.

20. The multiple particle beam system of claim 1, wherein: the sample region voltage supply is configured to apply a variable voltage to a sample stage on which the sample is placed; the detection system comprises first and second detection units; the first detection unit is controlled by the controller in the first detection mode; and the second detection unit is controlled by the controller in the second detection mode.

* * * * *